(12) United States Patent
Lin et al.

(10) Patent No.: US 6,624,480 B2
(45) Date of Patent: Sep. 23, 2003

(54) ARRANGEMENTS TO REDUCE CHARGING DAMAGE IN STRUCTURES OF INTEGRATED CIRCUITS

(75) Inventors: Wallace W. Lin, San Jose, CA (US); George E. Sery, San Francisco, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/964,618

(22) Filed: Sep. 28, 2001

(65) Prior Publication Data

US 2003/0068878 A1 Apr. 10, 2003

(51) Int. Cl.[7] .......................................... H01L 21/8234
(52) U.S. Cl. ........................................ 257/355; 257/367
(58) Field of Search .............................. 438/618, 237; 257/325, 355–367

(56) References Cited

U.S. PATENT DOCUMENTS

| 5,828,119 A | * | 10/1998 | Katsube | ...................... 257/491 |
| 6,034,433 A | * | 3/2000 | Beatty | ........................ 257/355 |
| 6,117,745 A | * | 9/2000 | Krishnan | .................... 438/303 |
| 2002/0063298 A1 | | 5/2002 | Wang | ........................ 257/379 |

OTHER PUBLICATIONS

U.S. patent application publication Wang, Pub. No. 2002/0063298 A1, May 30, 2002.

* cited by examiner

*Primary Examiner*—H. Jey Tsai
(74) *Attorney, Agent, or Firm*—Antonelli, Terry, Stout & Kraus, LLP

(57) ABSTRACT

Arrangements to reduce charging damage in structures of integrated circuits (ICs).

29 Claims, 20 Drawing Sheets

ARRANGEMENTS TO REDUCE CHARGING DAMAGE IN STRUCTURES OF INTEGRATED CIRCUITS

FIELD

The present invention is directed to arrangements to reduce charging damage in structures of integrated circuits (ICs).

BACKGROUND

Although both background as well as example embodiments of the present invention will be described in the example context of charging damage phenomena with respect to gate-oxide structures of metal oxide semiconductor—field effect transistors (MOSFETs) and during plasma processing operations to manufacture an IC, practice of the present invention may not be limited thereto. For example, practice of the present invention may have uses to protect other components structures of transistors as well as structures of other components during IC manufacturing, and further, may have uses to provide protection during other (differing) IC manufacturing processing operations.

Turning now to more detailed background discussion, an IC is made up of a tremendous number (e.g., millions) of components (e.g., transistors, diodes, capacitors), with each component being made up of a number of delicate structures, e.g., MOSFET transistors have delicate gate-oxide layers. As IC manufacturing technology continues to evolve and manufacturing of smaller-and-smaller sized components and more compacted ICs become reality, the delicate structures likewise become smaller-and-smaller and more compacted, and correspondingly, more-and-more delicate.

One or more stages of manufacturing of an IC may involve plasma processing, where a semiconductor wafer (having a plurality (many tens or hundreds) of ICs in a process of being formed on a surface thereof) is subjected to charged plasma particles, gases, etc. The inventors of the present invention have learned (e.g., through analysis) that plasma processing may lead to electrical charging of exposed IC structures (e.g., metallic lines), which charging may in turn lead to damage to the aforementioned delicate structures, e.g., through excessive charge build-up, and then subsequent damaging electrical discharge. What is needed are arrangements to reduce charging damage in delicate structures of ICs.

BRIEF DESCRIPTION OF THE DRAWINGS

The foregoing and a better understanding of the present invention will become apparent from the following detailed description of example embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and that the invention is not limited thereto. The spirit and scope of the present invention are limited only by the terms of the appended claims.

The following represents brief descriptions of the drawings, wherein.

DETAILED DESCRIPTION

Figure 1:
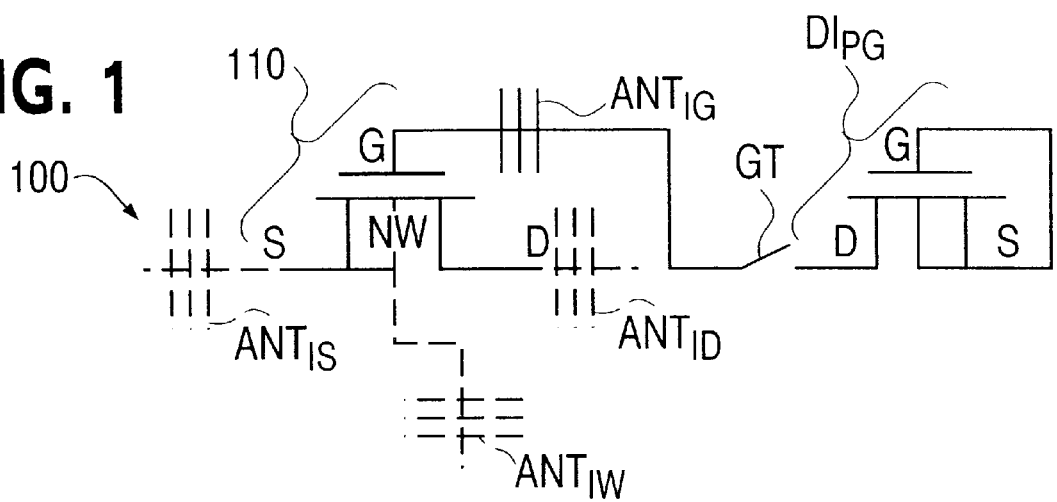
FIGS. 1–4 are example background (disadvantageous) transistor embodiments including inadvertent antenna and G-terminal gated-diode arrangements, such FIGS. being useful in gaining a more thorough understanding/appreciation of the present invention.

Before beginning a detailed description of the subject invention, mention of the following is in order. When appropriate, like reference numerals and characters may be used to designate identical, corresponding or similar components in differing figure drawings. Further, in the detailed description to follow, example sizes/models/values/ranges may be given, although the present invention is not limited to the same. Well known power/ground connections to ICs and other components may not be shown within the FIGS. for simplicity of illustration and discussion, and so as not to obscure the invention. Specific semiconductor (circuit and component) layouts also are not shown, and instead component arrangements may be shown in simple schematic and/or block diagram form in order to avoid obscuring the invention, and also in view of the fact that specifics with respect to implementation of semiconductor layouts are highly dependent upon the manufacturing platform within which the present invention is to be implemented, i.e., such specifics should be well within purview of one skilled in the art. Where specific details (e.g., circuits, flowcharts) are set forth in order to describe example embodiments of the invention, it should be apparent to one skilled in the art that the invention can be practiced without, or with variation of, these specific details. Finally, it should be apparent that differing combinations of hard-wired circuitry and software instructions can be used to implement embodiments of the present invention, i.e., the present invention is not limited to any specific combination of hardware and software.

Attention is directed to two additional patent applications filed on a same date as the present application, and having a same title and same inventors.

For ease of reading and for differentiation of differing example embodiments, a remainder of the Detailed Description section is subdivided into a plurality of sub-sections sub-titled as:

INTRODUCTION
EXAMPLE DISADVANTAGEOUS "GATE GATED-DIODE" EMBODIMENTS
"SOURCE, DRAIN, WELL GATED-GIODE" EXAMPLE EMBODIMENTS
"GATE, SOURCE, DRAIN, WELL ANTENNA" EXAMLE EMBODIMENTS
COMBINATION GATE-DIODE/ANTENNA EXAMPLE EMBODIMENTS
CONDUCTIVE "PLATE" EXAMPLE EMBODIMENTS
COMBINATION GATE-DIODE/ANTENNA/PLATE EXAMPLE EMBODIMENTS

A reading of all sub-sections may enhance an understanding of the invention to which the present disclosure is directed as the differing inventions are somewhat related and the differing sections may contain teachings relevant to other sections/inventions. However, it should be understood that the present application and/or patent is directed to (focused on) specific ones of sub-sections and inventions, such focus being apparent from the claims.

Introduction

As mentioned previously, example embodiments of the present invention will be described in the example context of charging damage issues with respect to gate-oxide structures of metal oxide semiconductor—field effect transistors (MOSFETs) and during plasma processing operations to manufacture an IC. Again, it is stressed that practice of the present invention may not be limited thereto.

Turning now to discussions, FIG. 1 shows a simplistic example embodiment 100 of an example floating source P MOSFET transistor 110, having a source S, gate G, drain D and N-well NW (a generic designation well W may be used hereinafter, to generically represent N-wells, P-wells, etc.). A gate-oxide layer (not shown) separating the G from other conductive IC structures (e.g., S diffusion, D diffusion, NW) may be only sub-microns thick, and thus may represent one of the aforementioned delicate structures.

Figure 47:
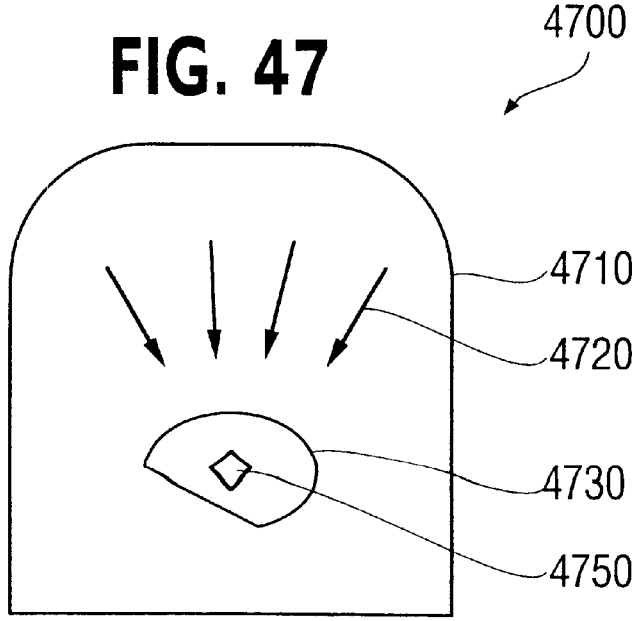
FIG. 47 illustrates a simplistic example plasma processing arrangement for applying plasma to a semiconductor wafer having at least one IC circuit being formed thereon.

Concerning plasma processing, FIG. 47 illustrates a simplistic example plasma processing embodiment 4700, including a plasma processing apparatus 4710 for applying plasma 4720 to a semiconductor wafer 4730 having at least one IC circuit 4750 being formed thereon. The IC circuit 4750 may contain a huge plurality of components having delicate structures, for example, the FIG. 1 transistor 110.

During plasma processing of the transistor 110, exposed structures (e.g., metallic interconnect lines, bus lines, polysilicon areas) of a semiconductor IC layout (not shown) of which transistor 110 is a component, may inadvertently and disadvantageously experience a receiving antenna effect, receiving charges from the plasma. More particularly, exposed portions of the semiconductor IC circuit may act as (unplanned) inadvertent receiving antennas $ANT_I$ (the subscript "I" designating that the ANT is inadvertent (not planned)) within a plasma processing environment. Such antenna effect may be illustrated representatively in FIG. 1 as an inadvertent gate-connected antenna $ANT_{IG}$ (the "G" subscript indicating that the ANT is connected to the G). Such $ANT_{IG}$ may even occur at a location remote from the transistor 110, and may even occur on a different IC layer (e.g., metal 3).

As charges accumulate on such $ANT_{IG}$ structure, the charges may be conducted (e.g., via conductive paths (e.g., metal lines) of the semiconductor IC layout) to areas representing delicate structures of the IC, e.g., conducted to the delicate gate-oxide area of the transistor 110. If the charges build to a damaging potential (e.g., 3.6 volts (V) will be used as a known example degradation potential throughout the present disclosure), the charges may attempt to discharge through the delicate structure to ground or to some other conductive structure of the IC, e.g., discharge with an excessive damaging current. Using the sub-micron thick gate-oxide layer as an example, discharge may melt or pop a hole in the gate-oxide layer such that the gate-oxide layer is no longer electrically insulated from other transistor structures (e.g., S diffusion, D diffusion, W) to result in transistor failure and very possibly an IC yield loss in IC manufacturing.

Example Disadvantageous "Gate Gated-diode" Embodiments

FIG. 1 further shows a somewhat advantageous "gated-diode" arrangement which may be used (albeit selectively as explained ahead) in an attempt to prevent damaging discharge. More particularly, illustration 100 further shows an example combination (i.e., "gated-diode" combination) of a gate (i.e., switch) GT and an example protective diode DI (in this example, subscripted as $DI_{PG}$ since the protective diode is connected to G), the diode itself may have a source S, gate G and drain D. That is, the S and G of $DI_{PG}$ are grounded such that $DI_{PG}$ structure operates as a diode.

A purpose of the protective gated-diode $DI_{PG}$ is to serve as a conduction path to cause any accumulated $ANT_{IG}$ plasma processing charges to be shunted (conducted) to ground, i.e., rather than being conducted to the delicate gate-oxide area to represent a dangerous discharge potential. The gate GT may be advantageously used to connect/disconnect the $DI_{PG}$ from the transistor 110, e.g., to disconnect after manufacturing such that the $DI_{PG}$ will not negatively affect operation (ground the G) of the transistor 110.

Figure 2:
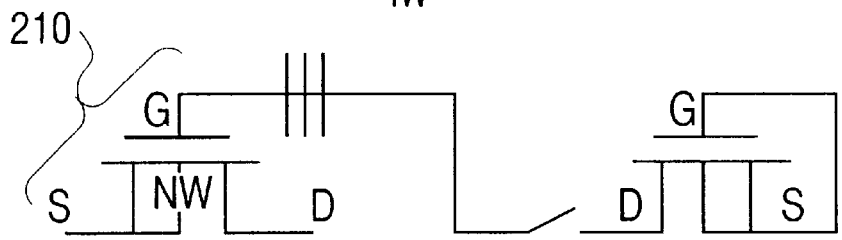
Figure 3:
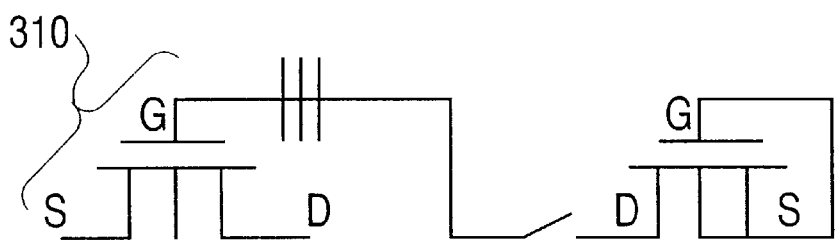
Figure 4:
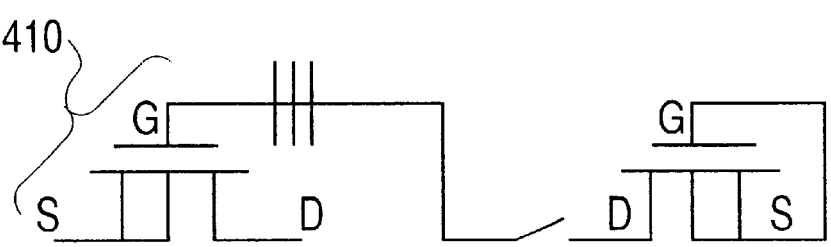

Whereas FIG. 1 shows a floating-source P MOSFET transistor 110 connected to the GT and $DI_{PG}$, FIGS. 2–4 are similar, with FIG. 2 instead showing an example embodiment of a grounded-source P MOSFET 210, FIG. 3 showing a floating-source N MOSFET 310, and FIG. 4 showing a grounded-sources N MOSFET 410. Further discussions of FIGS. 2–4 are similar to the discussions of FIG. 1, and thus may be wholly or at least partially omitted for sake of brevity/simplicity.

One disadvantage with the "gated-diode" approach is that the gated-diode consumes precious semiconductor real-estate. Accordingly, the gated-diode may not be applied to the G of every transistor, but instead, may only be applied sparingly to candidate transistors (across an IC perceived to have a propensity for discharge problems. As an example, with the FIGS. 1–4 gated-diode arrangements, an "antenna ratio" of potential antenna structures connected to delicate structures may be measured during design and/or testing to see if it violates a predetermined design rule. In the present gate-oxide example, it would be a "gate-antenna ratio" which would be measured.

As one non-exhaustive, non-limiting design rule example, if a perceived inadvertent antenna $ANT_I$ has a periphery or area size (i.e., plasma processing exposure periphery or area) which is greater than a predetermined area (e.g., known to potentially cause discharge problems/risk to the gate-oxide layer used), then such $ANT_I$ may be said to violate the predetermined design rule. For each transistor 110 having a potential design rule violation, the protective gated-diode arrangement $Di_p$ may be included as part of the transistor 110's layout design. For each transistor 110 not having a potential violation, the gated-diode arrangement may not be included as a space (semiconductor real-estate) saving measure.

An important problem with the above "gate gated-diode" arrangement may be that it does not consider and protect against similar antenna charging phenomena which may likewise occur with respect to the transistor's source S drain D terminals and/or well W. Accordingly, the present invention, addresses a flaw in the above "gate gated-diode" arrangement to further protect the gate-oxide from plasma charging damage in MOSFETs during metal etch process More particularly, a "Reverse-Mode" gate-charging mechanism (as opposed to the Normal-Mode mechanism) may occur when (see FIG. 5) there is a protecting device attached to the G of the protected MOSFET (P or N type). The protecting device may provide a leakage path from G to the P substrate such that the gate-oxide current begins to flow in a direction (e.g., from W to G (in a P MOSFET case) under a positive-bias plasma cycle [accumulation condition]) opposite to that it normally does (from G to W) during a plasma-charging event. The damage to gate-oxide during the Reverse-Mode gate-charging mechanism may likewise be devastating when the protecting device, such as a gated-diode, offers a very high leakage path. Further, the oxide damage in the Reverse-Mode gate-charging event may be even more aggravated when the total periphery length, or equivalently the total edge antenna ratio (defined as total periphery length divided by transistor gate area), of the metals (metal lines) leading to the S, D and W (NW for P MOSFET) terminal exceeds a certain threshold. The degradation may be further enhanced when the metal periphery length or edge antenna ratio at the G of the protected MOSFET is small. As a result, large damage in gate-oxide may occur.

As one possible explanation for the above-discussed phenomena, FIG. 1 shows in representative dashed (phantom) line form, a further (unplanned) inadvertent (e.g., inadvertently experienced by metal lines) source antenna $ANT_{IS}$, inadvertent drain antenna $ANT_{ID}$, and inadvertent well antenna $ANT_{IW}$ (electrically connected to the S, D and W, respectively) which may likewise and disadvantageously represent a plasma charging/discharging danger to the delicate gate-oxide layer. That is, during plasma processing, antenna-induced charges conducting from the inadvertent $ANT_{IS}$, $ANT_{ID}$, $ANT_{IW}$, structures to the S and/or D may build to a net damaging potential across gate oxide (e.g., 3.6 V) and may attempt to discharge through the delicate gate-oxide layer, e.g., to conduct through the G and the G's gated-diode arrangement to ground or another lower-potential IC structure. Again, the discharge (e.g., damaging current) may melt or pop a hole in the gate-oxide layer such that the gate-oxide layer is no longer electrically insulated from other transistor structures (e.g., S diffusion, D diffusion, W) to result in transistor failure and very possibly an IC yield loss in IC manufacturing.

Before continuing, it is briefly mentioned that redundant illustration and/or labeling of inadvertent antennas $ANT_{IG}$, $ANT_{IS}$, $ANT_{ID}$, $ANT_{IW}$ may also be omitted from FIGS. 2–4 (as well as related theoretical FIGS.) for sake of simplicity.

Figure 5:
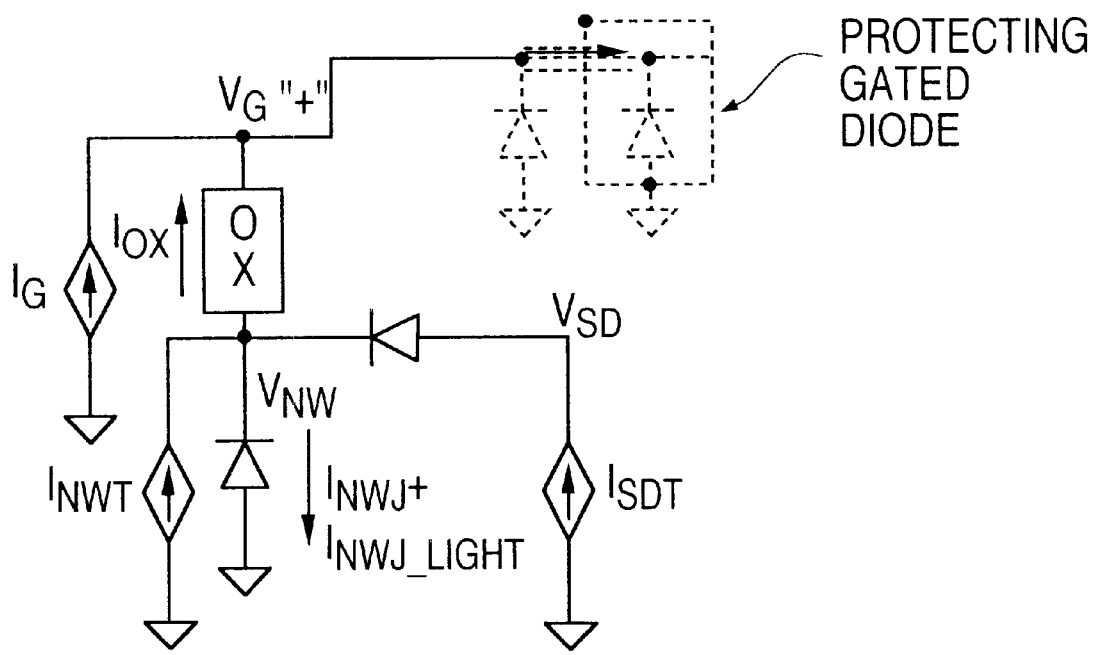
FIG. 5 is an example theoretical circuit useful in explanation and understanding of operation of the FIG. 1 example transistor embodiment, as well as disadvantages thereof.

Further attention is now directed to FIG. 5 which is a theoretical illustration of a P MOSFET with a gated-diode attached to G under positive-bias plasma cycles (accumulation). Such FIG. may be used in an alternative explanation of theoretical proof on the existence of the Reverse-Mode gate-charging effect in the "gate gated-diode" arrangement, and uses: an equivalent circuit to FIG. 1, Fowler-Nordheim Tunneling in the gate-oxide, and known process parameters. In FIG. 5, a P-MOSFET circuit and data are used for explanation purposes, but the underlying principle and mechanisms may be the same for P and N MOSFETs.

Relevant mathematical equations and FIGS are as follows:

$$I_{OX}=I_{NWJ}+I_{NWJ\_LIGHT}-I_{NWT}-I_{SDT}>0 \text{ Normal Mode} \quad \text{Eq.(1)}$$

$$I_{OX}=I_{NWJ}+I_{NWJ\_LIGHT}-I_{NWT}-I_{SDT}<0 \text{ Reverse Mode} \quad \text{Eq.(2)}$$

where $I_{OX}$ is an oxide layer current, $I_{NWJ}$ is an NW junction current, $I_{NWJ\_LIGHT}$ is an NW junction current caused by plasma light, $I_{NWT}$ is an NW terminal current, and $I_{SDT}$ is a combined S, D terminal current. Such formulas may be easily adapted for PW type transistor arrangements.

Figure 6:
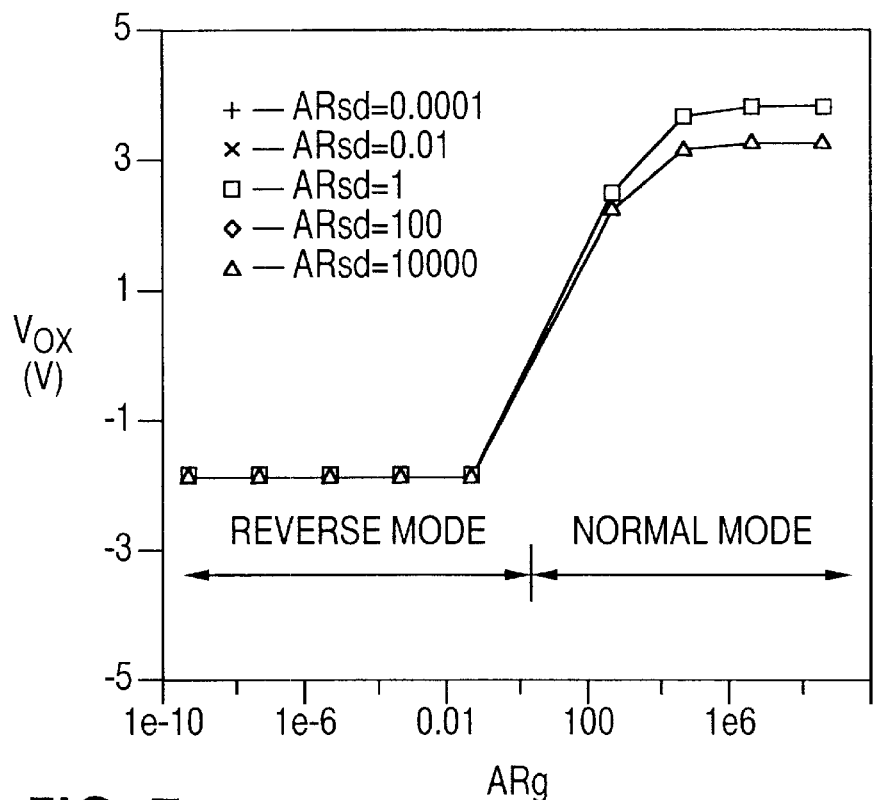
FIGS. 6–7 graph example data useful in explanation and understanding of operation of the FIG. 1 example transistor embodiment, as well as reverse-mode disadvantages thereof.
Figure 7:
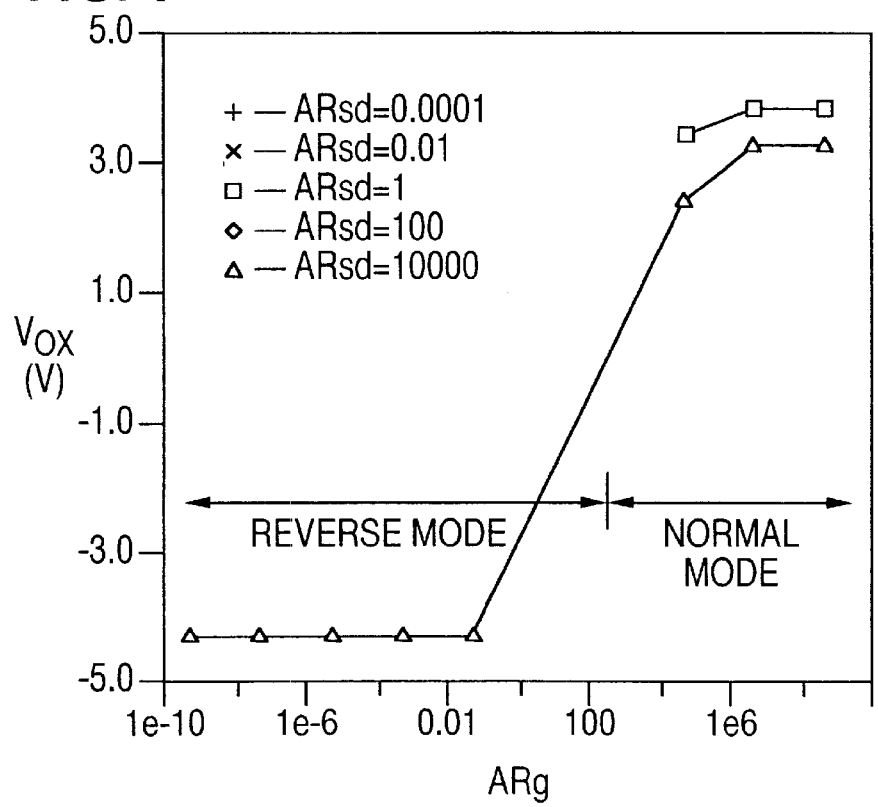

FIG. 6 graphs example data concerning oxide layer voltage Vox vs. gate-antenna ratio, where a plasma induced potential near the immediate vicinity of the protected transistor Vp=10V, a current of the protecting device Ipd=1e−13 Amp (where e means exponential), and an antenna ratio ARnw=1e4. FIG. 7 graphs example data concerning Vox vs. gate-antenna ratio, where Vp=10V, Ipd=1e−10 Amp, and ARnw=1e4 (in unit of um$^{-1}$). (Within the present and subsequent graphical FIGS. and discussions, "V" stands for voltage, "I" stands for current, "AR" stands for antenna ratio, "ox" stands for oxide layer, "p" stands for protecting device, "T" stands for terminal, and of course, "g, s, d, w" stand for gate, source, drain and well, respectively, while "nw" and "pw" further particularize an N-well and P-well, respectively.)

The above Eqs.(1) and (2) define the Normal and Reverse Mode of the gate-charging mechanism. As shown in the equivalent circuit in FIG. 5, a Reverse Mode occurs when the oxide current Iox (or equivalently, oxide voltage Vox)

changes sign (polarity) or direction, where the S/D and NW antenna begin to supply current into gate-oxide. (Reverse-Mode charging effect may happen in N MOSFET too. However, example P MOSFET arrangements may be mainly used for explanation.) In the presently discussed example, the sum of the antenna ratio at S, D and NW is assumed about 1K. When the leakage current of the protecting device (Ipd) is small (1e−13 Amp) as in the case of FIG. 6 which is the simulation based on a known technology and the equivalent circuit in FIG. 5, the Vox in the Reverse Mode is less than 2V which is well below the 3.6V threshold for degradation of the known gate-oxide. As Ipd increases up to 1e−10 Amp shown in FIG. 7, the Vox in the Reverse Mode may reach as high as 4.2V, exceeding the 3.6V threshold. Thus, damage in gate-oxide may be expected to occur in this case. The data in FIG. 7 theoretically demonstrates the "flaw" existing in the current "gate gated-diode" arrangement for protecting gate-oxide from gate-charging during metal etch process. This effect may be devastating to gate-oxide particularly when the protecting device, such as gated-diode, is able to provide a very high leakage path from the G to the P substrate.

Beyond theoretical explanation, the following represent experimental verification on the existence of the Reverse-Mode gate-charging effect in current gated-diode arrangement:
TestChip Result
Case: P MOSFET, Gate-Antenna Ratio—Cumed from M1 to M4 500,
  NW antenna Ratio ~600 at M5
  Gated-diode at M5
  Wafer pulled at EOL

| NW Size | % Fail @ Knee |
|---|---|
| Large | 3% |
| Small | 50% |

The fact that large NW size gives rise to smaller % fail indicates that the charging event here was in Reverse Mode where the larger the term, Inwj+Inwj__light in Eq.(2) (caused by larger NW size), the smaller the absolute value of the Iox or Vox with negative sign, hence the smaller % fail. The reason that the Reverse Mode was triggered here may be that: (i) there is a gated-diode attached to the G of the P MOSFET here at M5; (ii) the NW antenna ratio at M5 is close to 1K and (iii) there is not much gate-antenna ratio at M5.

"Source, Drain, Well Gated-diode" Example Embodiments

The problem described above may be solved with the following example "S, D and/or W gated-diode" embodiments. Such embodiments attach gated-diode arrangements to the S, D and/or the W (in addition to any attachment to the G) of the protected transistor. More particularly, the S, D and/or W gated-diodes in these example embodiments pull down the potential at, S, D and W (for P MOSFET) terminal to nearly at the substrate potential (a few tenths volts), hence reducing the potential across the gate-oxide to nearly zero volt during the Reverse-Mode gate-charging event. The nearly zero-volt potential across the gate-oxide helps ensure that the potential for damage is minimized.

Simplified illustrations of various example embodiments (i.e., transistor arrangements) according to the above are now illustrated and described as follows.

Figure 8:
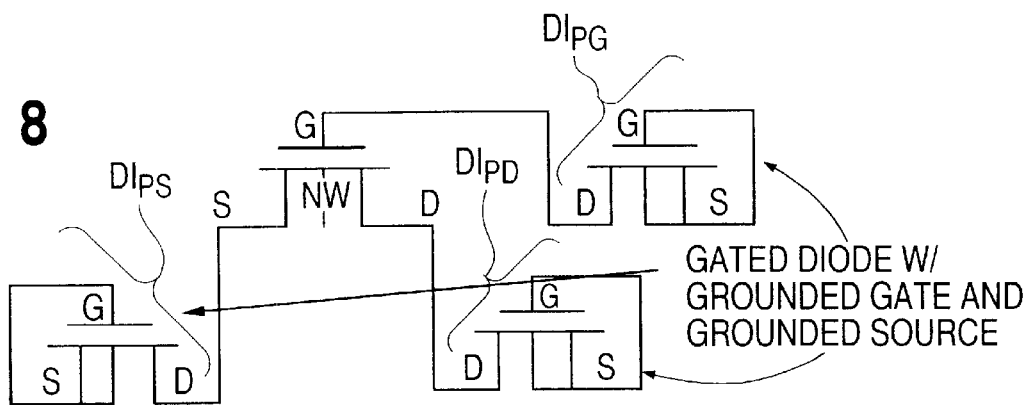
FIGS. 8–11 are example transistor embodiments including protective example S, D, and/or W gated-diode arrangements, such FIGS. being useful in gaining a more thorough understanding/appreciation of protective gated-diode embodiments of the present invention.
Figure 9:
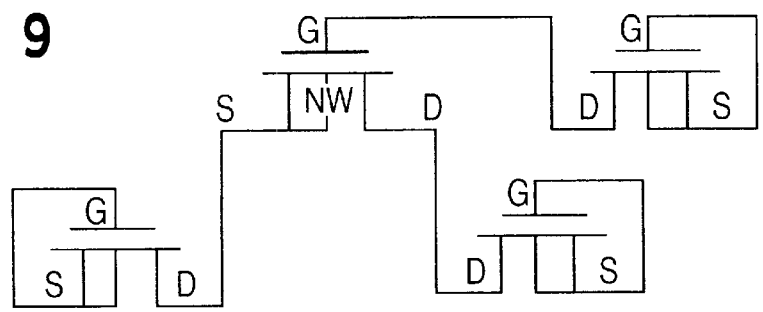
Figure 10:
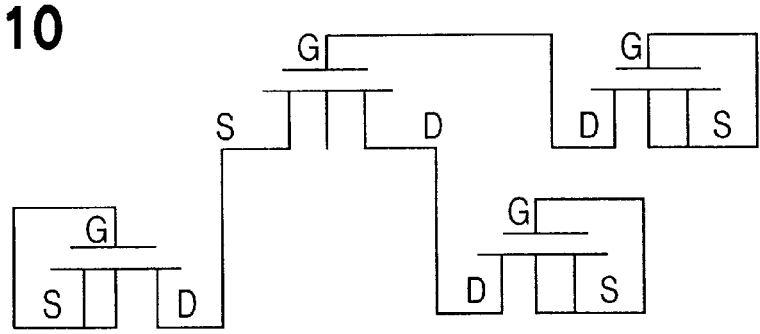

In a first group of simplistic example embodiments, a gated-diode is attached to the S and the D, in addition to the G, of the protected grounded- and and floating-source P MOSFET and floating-source N MOSFET. More particularly, FIG. 8 illustrates a floating-source P MOSFET with protective gated-diode $DI_{PG}$ attached to the G, protective gated-diode $DI_{PS}$ attached to the S and protective gated-diode $DI_{PD}$ attached to the D. FIG. 9 illustrates a grounded-source P MOSFET with similar protective gated-diodes attached to G, S and D. FIG. 10 illustrates a floating-source N MOSFET with protective gated-diodes attached to G, S and D.

Figure 11:
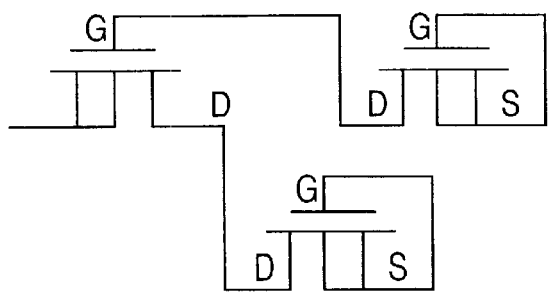

In a second group of simplistic example embodiments, a gated-diode is attached to the D, in addition to the G, of the protected grounded-source N MOSFET. More particularly, FIG. 11 illustrates a grounded-source N MOSFET with gated-diode attached to the G and D.

Redundant labeling of protective gated-diodes may be omitted wholly from FIGS. 8–11 (as well as related theoretical FIGS.) for sake of simplicity. Further, illustration of the inadvertent antenna $ANT_{IG}$ may be omitted wholly or at least partially from FIGS. 8–11 (as well as related theoretical FIGS.) for sake of simplicity. Finally, further discussions of FIGS. 8–11 are similar to the discussions of FIG. 8, and thus redundant discussions may be wholly or partially omitted for sake of brevity/simplicity.

Example theoretical circuit embodiments having the S, D and/or W gated-diode protection mechanism are now detailed below using both grounded- and floating-source cases for P and N MOSFET under positive- and negative-bias plasma cycles (corresponding to the accumulation [inversion] and inversion [accumulation] condition for the P [N] MOSFET).

Figure 12:
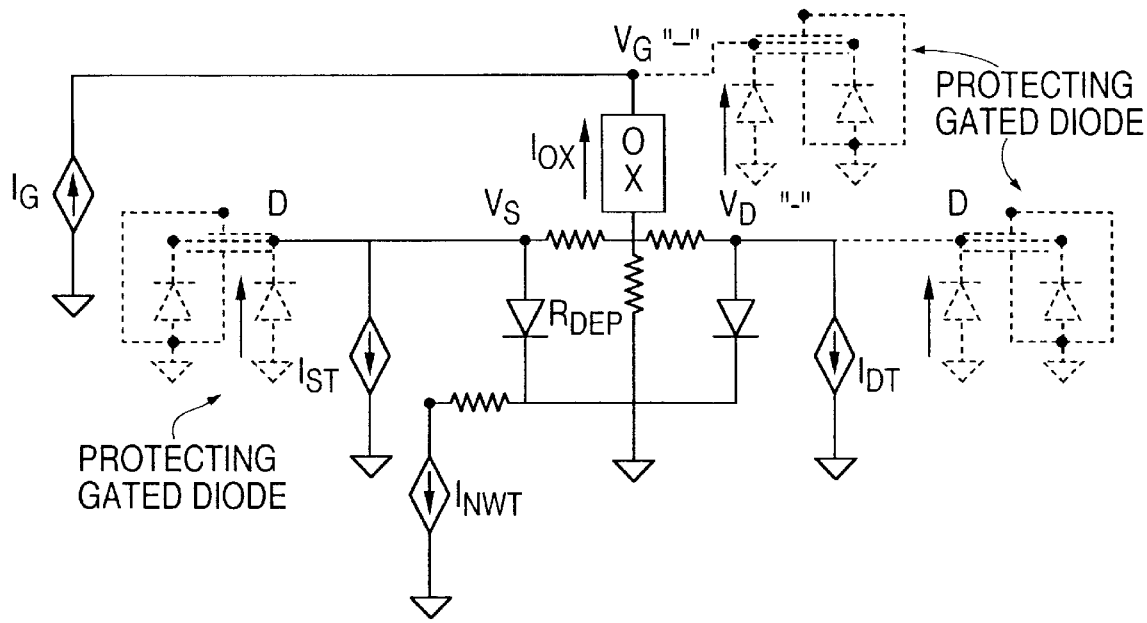
FIGS. 12–15 are example theoretical circuits useful in explanation and understanding of operation of the FIGS. 8–11 example protective gated-diode embodiments, as well as advantages thereof.
Figure 13:
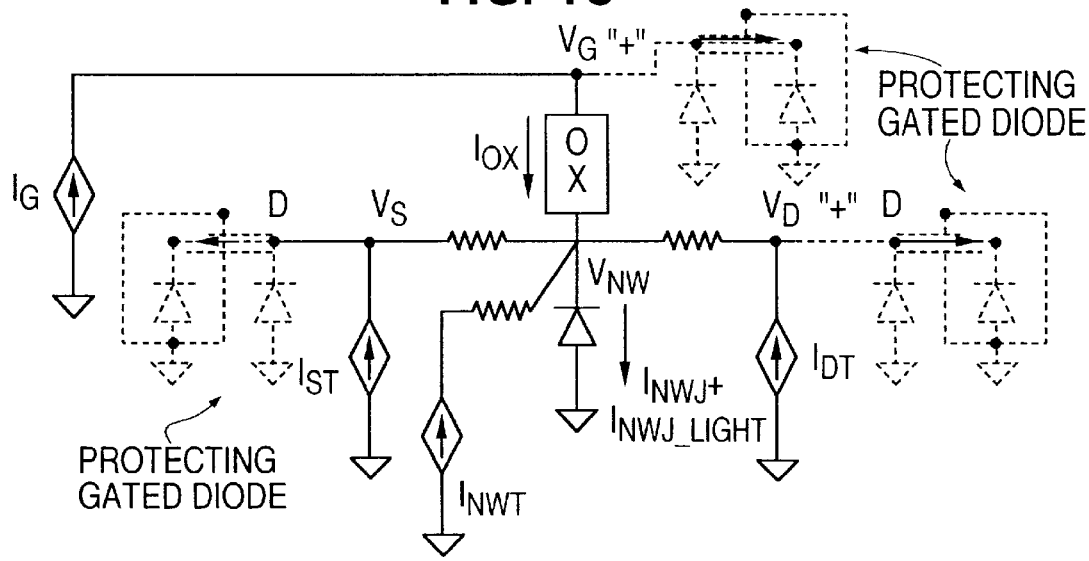

Discussing P MOSFET example embodiments first, FIG. 12 illustrates an example P MOSFET with S not tied to NW during negative-bias plasma cycles (Inversion condition). Three gated-diode arrangements are each attached to the G, S and D terminal, respectively. Plasma Current absorbed at the G, S, D and NW terminal, $I_G$, $I_{ST}$, $I_{DT}$ and $I_{NWT}$, are show representatively as voltage controlled current sources controlled as a function of the plasma potential, the antenna ratio and the potential at the respective terminal. For the case of P MOSFET with S tied to NW, simply short the S/NW diode in this figure. In contrast to FIG. 12, FIG. 13 illustrates an example P MOSFET with S tied or not tied to NW during positive-bias plasma cycles (accumulation condition). A gated-diode is attached at the G, S and D terminal. Note that the illustration here applies to both cases of P MOSFET with S tied and not tied to NW.

Turning now to further description of the above P MOSFET examples, in a grounded S case—S tied to NW, the S will be at the NW potential which is determined by the combined antenna ratios at both the S and NW terminals. During positive-bias plasma cycles, the P MOSFET is in an accumulation condition where the D junction is forward-biased and NW/P__substrate junction is reverse-biased. In this condition, most of the plasma current absorbed at the G terminal, $I_G$, is drained by the sub-threshold leakage flowing from D to S in the gated-diode attached at the G of the P MOSFET. The gated-diode here is an N MOSFET with G and S tied to P substrate and typically with a design-rule channel length. Its sub-threshold leakage is typically more than 1e−10 Amp, driving G potential down to nearly the P__substrate potential. Similarly, the plasma current absorbed at the S and NW terminal, $I_{ST}$ and $I_{NWT}$, are drained by the sub-threshold current of the gated-diode attached at the S terminal, driving the S (and NW) potential to nearly the P_substrate potential. The same protection mechanism in this accumulation condition (positive-bias cycles) also applies to the D terminal and drives the D potential down to nearly P_substrate potential.

During negative-bias plasma cycles, the P MOSFET is in an inversion condition where the D junction is reverse-biased and NW/P_substrate junction forward-biased. The forward-biased D-to-substrate junction in the gated-diode attached to the G of the PMOSFET drives the G potential down to nearly the P_substrate potential. The S (and NW) potential may be driven down to nearly the P_substrate potential by either the forward-biased D-to-substrate junction in the gated-diode attached to the S of the P MOSFET or the forward-biased NW/P_substrate junction. It may be the same case for the D potential here.

Therefore, the potential across the gate-oxide during both positive- and negative-bias plasma cycles may be maintained at nearly zero volt. This ensures a best possible protection with minimum damage in the gate-oxide.

In a differing floating S case—S not tied to NW, the S will be at the NW potential only during positive-bias cycles (in accumulation condition) where the S/NW junction is forward-biased. In this condition, the protection mechanism may be the same as that of the grounded-source case in the accumulation condition. During negative-bias cycles (in inversion condition), the S/NW junction is reverse-biased and NW/P_Sub junction forward-biased. The gated-diode at the S terminal helps drain away the S terminal current, while the forward-biased NW/P_Sub junction helps drain away the NW terminal current.

The protection mechanism at the G terminal may be the same for both grounded- and floating-source case. Again, the potential across the gate-oxide will be maintained at nearly zero volt during the plasma event.

Note that the gated-diode may have to be attached to both the S and D terminal of the protected MOSFET. The consequence of not doing so may be an aggravation of the Reverse-Mode gate-charging effect—a gate-charging mechanism which may possibly cause large damage in the gate-oxide. The following details the reason.

Assume that a gated-diode is attached at the D, not the S. Under such circumstance, except during the inversion condition in the grounded-source case where NW and thus S terminal may be pulled down to near P_Substrate potential by the forward-biased NW/P_Sub junction, the potential at the S and D terminal may be different from one another depending on the antenna ratio at the two terminals. If the antenna ratio at the S terminal is high, a potential gradient with a high potential at the S side may be formed along the G channel between the S and D (D potential may be always near the P_substrate potential due to the attached gated-diode). As a result, a large potential drop exists across the gate-oxide between the S and G terminal. A large current thus flows in the gate-oxide from the channel near the S to the G and may cause damage there. To shut off this devastating effect in the Reverse-Mode gate-charging event, a gated-diode at the S terminal may be required.

It is also noted at this point, that the gated-diode attached at the S or D terminal cannot be replaced by a small n+p junction diode. The reason may be that the small leakage in this reversed-biased n+p junction diode will not provide much drainage for the S, D and NW terminal current. The consequence of this may again be an aggravation of the Reverse-Mode gate-charging effect where most of the S, D and NW terminal current which are not drained by the small n+p junction diode, will flow into gate-oxide and may cause damage thereto.

Figure 14:
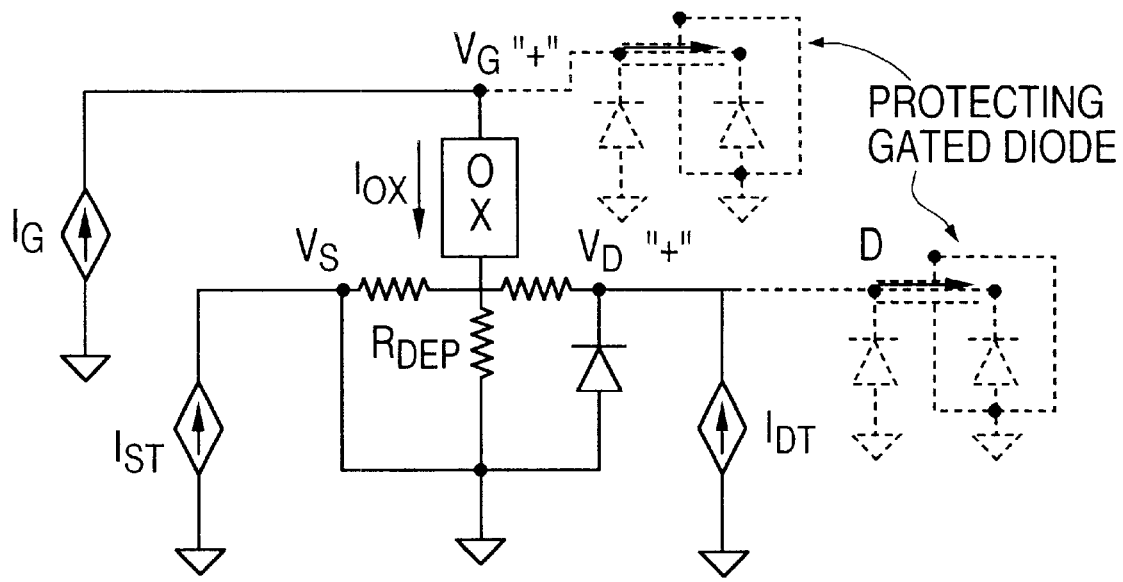
Figure 15:
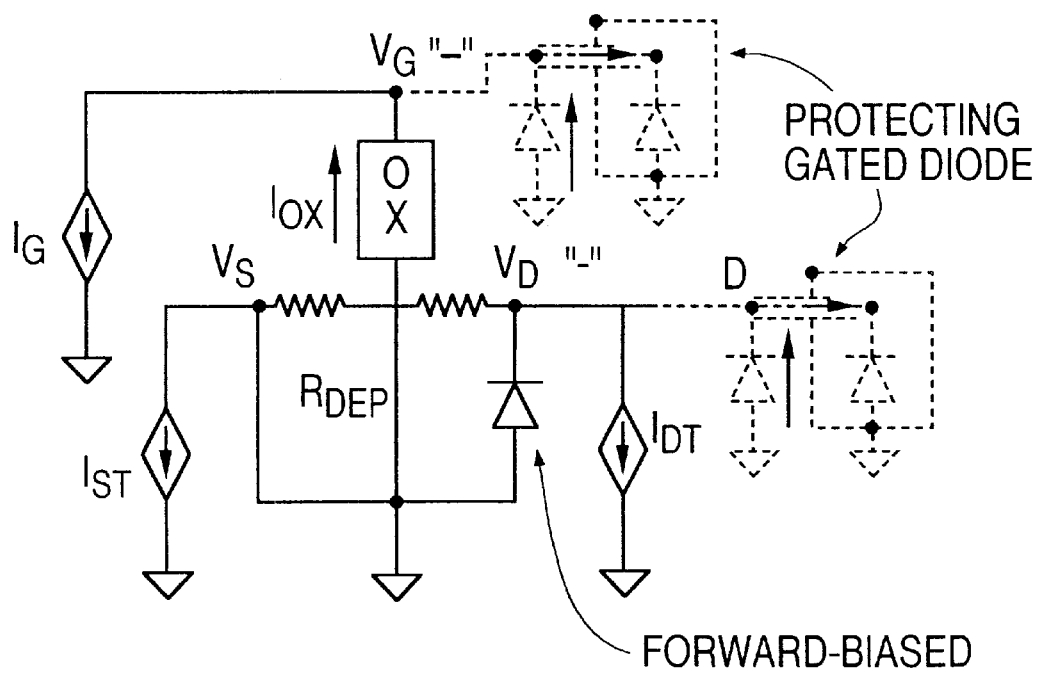

Discussing N MOSFET example embodiments next, FIG. 14 illustrates an example N MOSFET with S tied to P substrate during positive-bias plasma cycles (Inversion condition). Two gated-diodes arrangements are each attached to the G and D terminal, respectively. Plasma current absorbed at the G, S and D terminal, $I_G$, $I_{ST}$ and $I_{DT}$, are expressed as voltage controlled current sources which are controlled as a function of the plasma potential, the antenna ratio and the potential at the respective terminal. FIG. 15 illustrates an example N MOSFET with S tied to P substrate during negative-bias plasma cycles (accumulation condition). A gated-diode arrangement is attached at the G and D terminals.

Turning now to further description of the above N MOSFET examples, the example protection mechanisms illustrated in FIGS. 14 and 15 are for only grounded-source N MOSFETs. The protecting mechanism in floating-source N MOSFETs may be similar to that in P MOSFETs as they have the same protection configuration.

In a grounded S case—S tied to PW (FIG. 14), during positive-bias plasma cycles, the N MOSFET is in an inversion condition where the drain/P_substrate junction is reverse-biased. In this condition, most of the plasma current absorbed at the G terminal, $I_G$, may be drained by the sub-threshold leakage flowing from D to S in the gated-diode attached at the G of this N MOSFET, driving the G potential down to nearly the P_substrate potential. Similarly, the plasma current absorbed at the D terminal, $I_{DT}$, may be drained by the sub-threshold leakage of the gated-diode attached at the D terminal, driving the D potential to nearly the P_substrate potential. The plasma current absorbed at the S terminal, $I_{ST}$, may be drained to the P substrate since the S is tied to the P substrate.

During negative-bias plasma cycles, as shown in FIG. 15, this N MOSFET is in an accumulation condition where the drain/P_substrate junction is forward-biased. At the same time, the drain/P_substrate junction in the gated-diodes attached to the G and D terminal of the protected N MOSFET is also forward-biased. With assistance of these forward-biased drain/P_substrate junctions at the G and D terminal of the protected MOSFET, both the G and D potential are pulled down to nearly the P substrate potential. As a result, during the full plasma cycle, the potential across the G will be maintained at nearly zero volt. This assures that the charging damage in the gate-oxide may be minimized.

Figure 16:
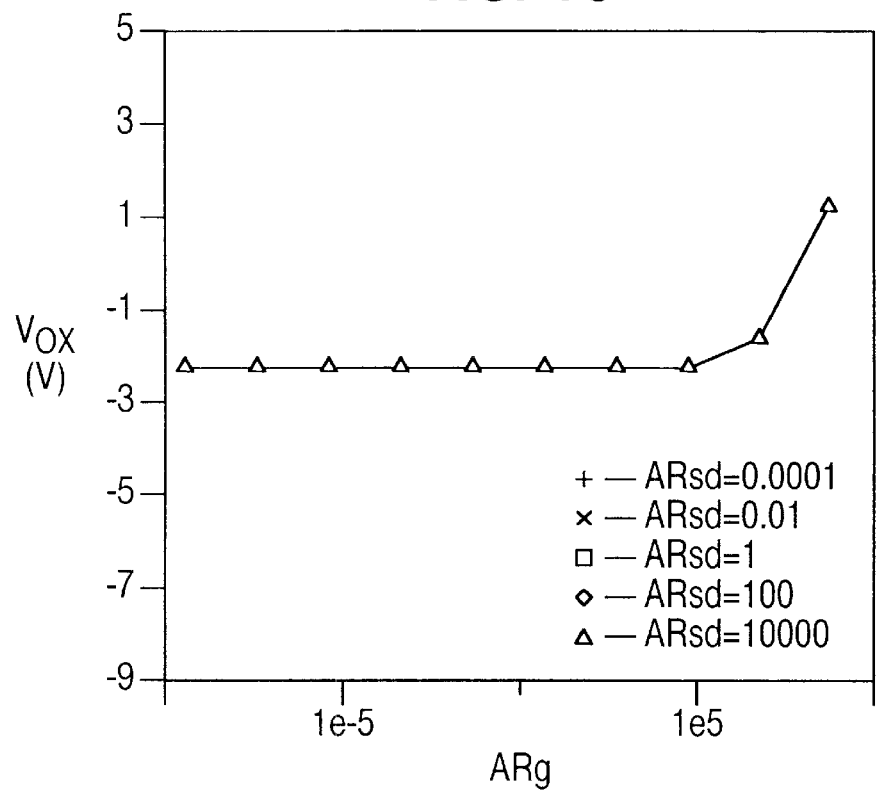
FIGS. 16–17 graph example data useful in explanation and understanding of operation of the FIGS. 8–11 example protective gated-diode embodiments, as well as advantages thereof.
Figure 17:
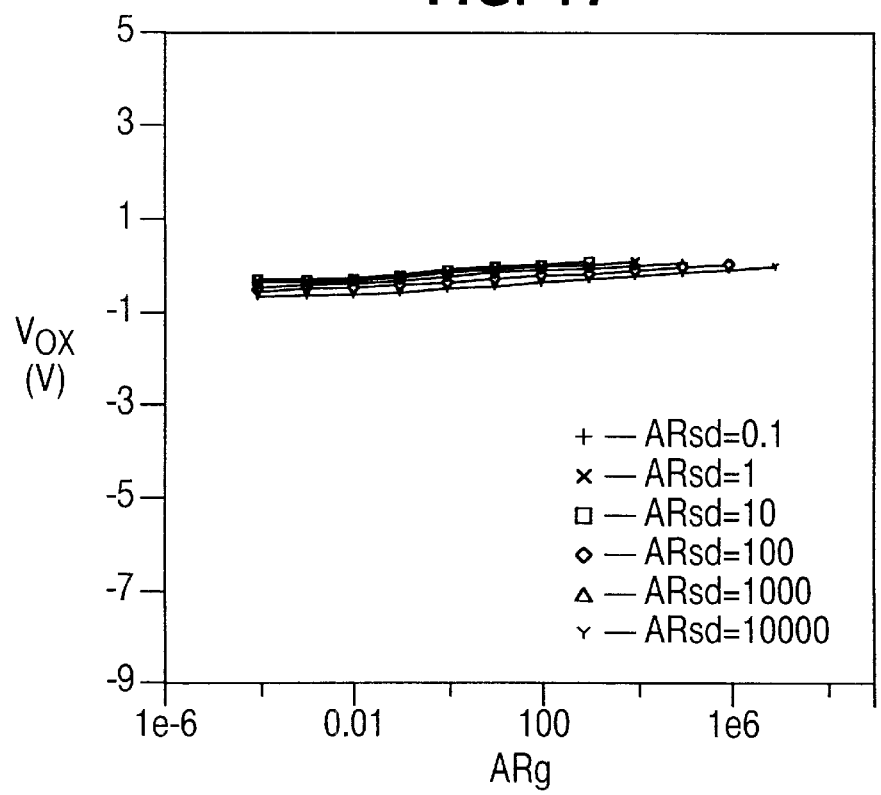

Turning now to further theoretical proof that the above example embodiments can fix the aforementioned flaw in the current "gate gated-diode" arrangement, FIG. 16 illustrates example data concerning Vox vs. gate-antenna antenna ratio, where a set-up has Vp=10V, ARnw=1e8 (in unit of um$^{-1}$), gated-diode at G, S and D, and a floating-source P MOSFET in accumulation. FIG. 17 illustrates example data concerning Vox vs. gate-antenna ratio, where a set-up has Vp=10V, gated-diode at G, S and D, and a floating-source P MOSFET in inversion—No dependence on NW antenna ratio.

More particularly, FIGS. 16 and 17 show the simulated result for a floating-source P MOSFET, with gated-diode attached to G, S and D, in an accumulation and inversion condition, respectively. Again, known technology process parameters were used in simulation. With the gate-antenna ratio up to 1e9 and the sum of the S, D and NW antenna ratio up to 1e8, the simulated Vox in an accumulation condition is between 1.1 and 2.2 V, while it varies between 0 and 0.6V in an inversion condition. This result indicates that the present example embodiments can sufficiently protect the gate-oxide during the gate-charging event since the real circuits will never see an antenna ratio at the transistor terminals reaching so high.

In a beginning summary of the above "S, D and/or W gated-diode" example embodiments, the embodiments are able to minimize the plasma process induced charging damage in gate-oxide during Metal Etch by using gated-diode as the protecting device. This invention applies to both P and N MOSFETs.

For P MOSFETs (source tied (grounded) or not tied (floating-source) to NW) and N MOSFETs with source not tied (floating source) to PW, a gated-diode may be attached to the G, S and D terminal of the protected transistor. For N MOSFETs with source tied (grounded-source) to PW, a gated-diode may be attached to the G and D terminal of the protected transistor.

With the above-described arrangements, sufficient protection for the gate-oxide may be achieved independent of the total periphery length of the metal lines and/or buses leading to all terminals (G, S, D or W [NW for P transistor]) of the protected transistor by minimizing the gate-oxide damage during the Reverse-Mode gate-charging effect. In summarizing an example use of the embodiments in a single sentence, embodiments may use G, S, D and/or W gated-diodes to minimize gate-oxide charging damage in MOSFETs during metal etch processes for silicon-based integrated circuits.

"Gate, Source, Drain, Well Antenna" Example Embodiments

The above G, S, D, W gated-diode arrangements may be disadvantageous in terms of inefficient use of IC die space (semiconductor real-estate). That is, as mentioned previously, each inclusion of a gated-diode arrangement represents an arrangement added to the IC, and therefore, consumes precious IC die space and also disadvantageously serves to increase a complexity of the IC die. Accordingly, discussion turns now to example planned protective antenna embodiments which may be advantageous in terms of IC die space savings.

More particularly, the aforementioned problem can be solved by using a planned "protective metal antenna $ANT_P$" as a protecting means, i.e., instead of a gated-diode. One simplified illustration of an example embodiment (transistor arrangement) according to the above is now illustrated and described as FIG. 18 which illustrates an example floating-source P MOSFET with an (metal) antenna at S, D and NW to help reduce charging damage. More particularly, as opposed to the previously-discussed inadvertent gate antenna $ANT_{IG}$, inadvertent source antenna $ANT_{IS}$, inadvertent drain antenna $ANT_{ID}$, inadvertent well antenna $ANT_{IW}$, which were all inadvertent/unplanned (and thus unpredictable, causing potential discharge problems), the present example embodiments use planned (e.g., designed) protective antennas $ANT_P$, i.e., protective source antenna $ANT_{PS}$, protective drain antenna $ANT_{PD}$, protective well antenna $ANT_{PW}$, electrically connected to provide protection to the S, D and W, respectively.

The protective antennas $ANT_P$ are advantageous over the protective gated-diodes in terms of IC die space savings in that the such antennas may be able to be provided by structures (e.g., metal lines, bus lines, etc.) which already exist in the IC, rather that being structures newly added to the IC. Often, such protective antennas may be able to be provided by a simple redesigning of an already existing structure.

Figure 18:
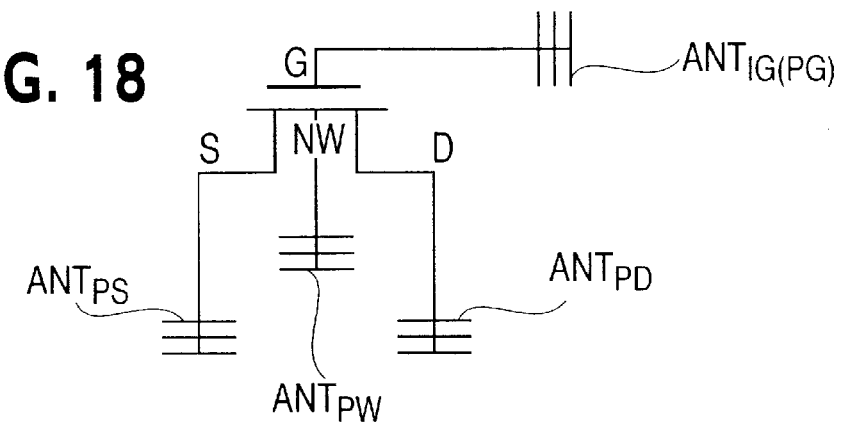
FIGS. 18–21 are example transistor embodiments including protective example S, D, W and/or G antenna arrangements, such FIGS. being useful in gaining a more thorough understanding/appreciation of protective antenna embodiments of the present invention.

While FIG. 18 illustrates the gate antenna as an inadvertent gate antenna $ANT_{IG}$, the further "(PG)" designation within such FIG. is for the purpose of making it clear that the gate antenna itself may alternatively be a planned protective gate antenna $ANT_{PG}$. Use of a planned protective gate antenna $ANT_{PG}$ may be advantageous in that a designer may then be dealing with a known gate antenna (having known values, e.g., AR) as opposed to an inadvertent antenna, and thus the designer may be able to more accurately design the S, D and W protective arrangements and provide better overall protection to the delicate structure (e.g., gate oxide) and component (e.g., transistor).

Still further, while the planned antennas may be best and most easily implemented as "metal" antennas using metal wiring lines (e.g., M1–M5+ layers), practice of the planned antennas of the present invention is not limited to metal and/or wiring lines, and accordingly, the word metal is sometimes enclosed within parenthesis as "(metal)" at locations throughout the disclosure to stress such non-limitations.

The protective antennas were provoked by a new finding verified both experimentally and theoretically (i.e., simulation) that an increase of the total antenna ratio (defined as total periphery length divided by transistor G area), or equivalently total periphery length, of the metal lines and/or buses leading to the S, D and W (NW for P MOSFET) terminal in MOSFETs may help reduce charging damage in gate-oxide in a "Normal-Mode gate-charging" event. This total antenna ratio or periphery length may be limited to be increased to a certain finite amount which is dependent on the pre-determined maximum allowable antenna ratio or periphery length of the metal lines and/or buses leading to the G terminal. It may be also limited by the bimodal-Vox effect in MOSFETs in an inversion condition under plasma exposure.

The role of the metal antenna at each G, S, D and W (NW for P MOSFET) terminal of the protected MOSFET during the Reverse-Mode gate-charging event becomes opposite to that during the Normal-Mode event. In the Normal-Mode event, the G antenna plays the role of a charge supplier while the antenna at the remaining terminals play the role of a charge compensator. In the Reverse-Mode event, these roles become opposite. The current flowing in the gate-oxide is determined by the net charge contributed from all terminals. Thus, by suppressing the role of the charge suppliers that the S, D and W terminals play during the Reverse-Mode event, one is able to reduce and confine the net charge in the gate-oxide to a degree that the voltage across the gate-oxide falls into a range assuring that damage to gate-oxide may be minimized. This may be achieved by limiting the total periphery length or equivalently the total antenna ratio of the metals (lines and/or buses) leading to the S, D and W (NW for P MOSFET) terminal to below a certain value.

As one advantage, through use of the planned protective antennas, the pre-determined maximum allowable gate-antenna ratio may be much higher than the one in the above (non-antenna) protective arrangements as a result of such S-, D- and W-antenna-assisted gate-oxide current reduction mechanism. This may significantly reduce the number of MOSFETs violating the design rule, and hence may render significant space saving in an IC circuit by eliminating many gated-diodes which otherwise might be necessary. More particularly, with use of planned protective antennas, fewer MOSFETs may fail a design rule check and may require protection by a gated-diode attached to their G.

Figure 19:
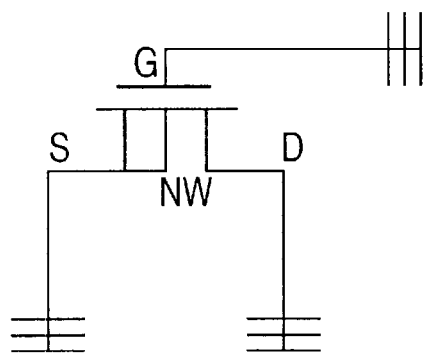
Figure 20:
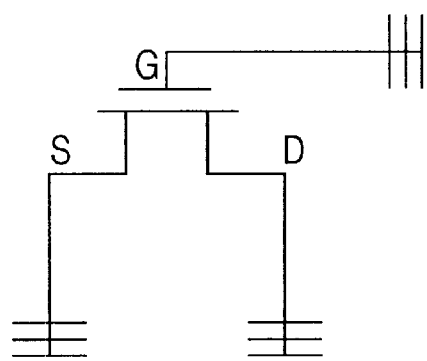
Figure 21:
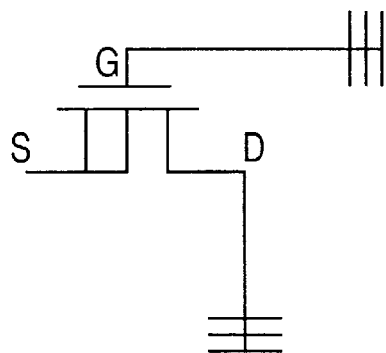

Simplified illustrations of additional example embodiments (transistor arrangements) according to the above, are now illustrated and described as follows. More particularly, FIG. 19 illustrates an example grounded-source P MOSFET with an (metal) antenna at S and D to help reduce charging damage, FIG. 20 illustrates an example floating-source N MOSFET with an (metal) antenna at S and D to help reduce charging damage, and FIG. 21 illustrates an example grounded-source P MOSFET with an (metal) antenna at D to help reduce charging damage. Redundant illustration and/or labeling of inadvertent antenna $ANT_{IG}$, and of planned antennas $ANT_{PG}$, $ANT_{PS}$, $ANT_{PD}$, $ANT_{PW}$, may be omitted wholly or at least partially from FIGS. 18–21 (as well as related theoretical FIGS.) for sake of simplicity. Further, further discussions of FIGS. 19–21 are similar to the discussions of FIG. 18, and thus redundant discussions may be wholly or partially omitted for sake of brevity/simplicity.

Figure 22:
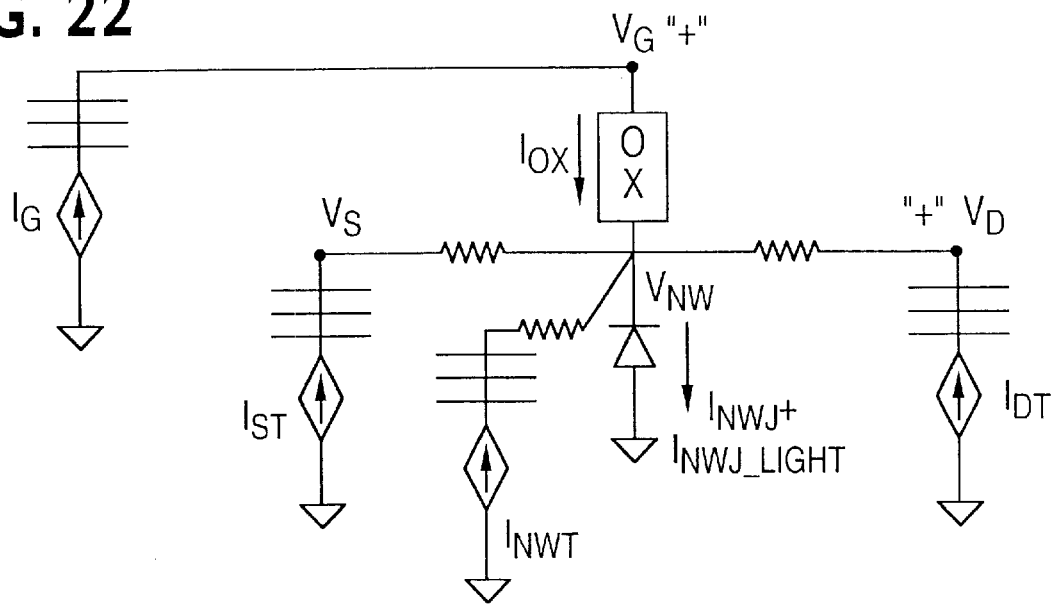
FIGS. 22–23 are example theoretical circuits useful in explanation and understanding of operation of the FIGS. 18–21 example protective antenna embodiments, as well as advantages thereof.

Turning now to theoretical discussions tending to prove a viability of the above, FIG. 22 illustrates an example P MOSFET with source tied or not tied to NW during positive-bias plasma cycles (accumulation condition). A total (metal) antenna at the S, D and W terminal may be limited to be above a certain finite number to help reduce charging damage to the gate-oxide in the Normal-Mode gate-charging event. This invention may take advantage of a metal-antenna-assisted Vox reduction mechanism during a plasma event, a recent new finding. This phenomenon appears in the Normal-Mode gate-charging event, the Normal Mode condition being defined by following Equation:

$$I_{OX}=I_{NWJ}+I_{NWJ\_LIGHT}-I_{NWT}-I_{ST}-I_{DT}>0 \text{ Normal Mode} \quad \text{Eq.(3)}$$

where $I_{OX}$ is an oxide layer current, $I_{NWJ}$ is an NW junction current, $I_{NWJ\_LIGHT}$ is an NW junction current caused by plasma light, $I_{NWT}$ is an NW terminal current, $I_{ST}$ is a S terminal current, and $I_{DT}$ is a D terminal current. Such formulas may be easily adapted for PW type transistor arrangements.

The above Equation may be derived from FIG. 22 illustrating a P MOSFET during positive-bias plasma cycles (accumulation condition). In this case, gate-oxide current is supplied by the charges absorbed from plasma at the G terminal. The S, D and W terminal absorb the charges from plasma and these charges flow in the gate-oxide in a direction opposite to those supplied from the G terminal. As a consequence, the S, D and W terminal currents offset the G terminal current. Meanwhile, the net gate-oxide current may be limited by the sum of the dark and illuminated NW/P__ sub junction leakage. This mechanism explains why during a plasma event such as metal etch process, the S, D and W antenna can help reduce gate-charging damage through the reduction of the gate-oxide current by increasing their total antenna ratio to above certain number (larger terminal antenna ratio contributes larger terminal current).

Figure 23:
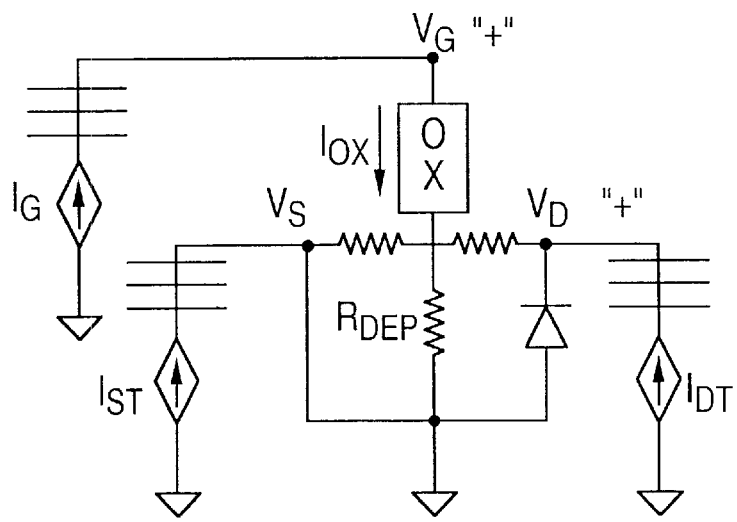

FIG. 23 illustrates an example N MOSFET with source not tied to P substrate during positive-bias plasma cycles (inversion condition). A total (metal) antenna at the S and D terminal, in this case, may be limited to above a certain finite number to help reduce charging damage to gate-oxide in the Normal-Mode gate-charging event. The principle of the (metal) antenna-assisted reduction on gate-oxide current or voltage here may be the same as that in the P MOSFET case. By increasing the total S and D antenna ratio, less gate-charging damage may be expected in this N MOSFET.

The total amount of antenna ratio to increase in the S, D and W terminal may be limited by two factors. One may be the predetermined maximum allowable gate-antenna ratio and the other the behavior of the bimodal Vox state in the inversion condition of the MOSFETs (see FIGS. 25, 26 for more details). The larger the predetermined maximum allowable gate-antenna ratio, the larger the total amount of S, D and W antenna ratio may increase.

With the present example antenna embodiments, it is expected that the maximum allowable gate-antenna ratio can be much higher than the one in the above-described (non-antenna) embodiments. Thus much fewer MOSFETs may fail to pass the design rule check and require protection of a gated-diode. This may effectively reduce the space occupied by those many gated-diode in circuits protected by the above-described (non-antenna) embodiments. As a result, design for more lean and efficient circuits may be realized.

Turning now to experimental/simulation discussions, the following example experimental data validating the antenna embodiments was obtained:
Known N MOSFET M2__Antenna Gate__AR=2K Source__
Float 1NAC (i.e., small n+p junction) Diode @M2
10NAC Diode @M5 Pulled at EOL

| Strct # | S + D AR | % Fail @ Knee |
|---|---|---|
| 1 | Reference + Source__Gnd | 15 |
| 2 | Minimum | 0 |
| 3 | 200 | 0 |
| 4 | 5 | 0 |
| 5 | 1000 | 0 |
| 6 | 20 | 0 |
| 7 | 2000(D) + Source__Gnd | 8 |
| 8 | 500 + 10 × S/D Size | 0 |
| 9 | 200 + 10 × S/D Siz | 0 |
| 10 | 100 + 10 × S/D Siz | 6 |

From the above-listed Struc #1 and #7, an increase of a D antenna ratio from a minimum to 2000, reduces a % fail from 15% to 8%. From Struc #8, #9 and #10, with a reducing of a S/D antenna ratio from 500 and 200 to 100, a % fail increases from 0% to 6%. This demonstrates experimentally that an increase of S and D antenna ratio may help reduce gate-oxide charging damage.

Simulations based on a floating-source P MOSFET and known technology were further performed to investigate the effect of the S, D and W antenna on gate-charging damage, and validate the example antenna embodiments. In such simulation, there is no protecting device attached to the transistor.

Figure 24:
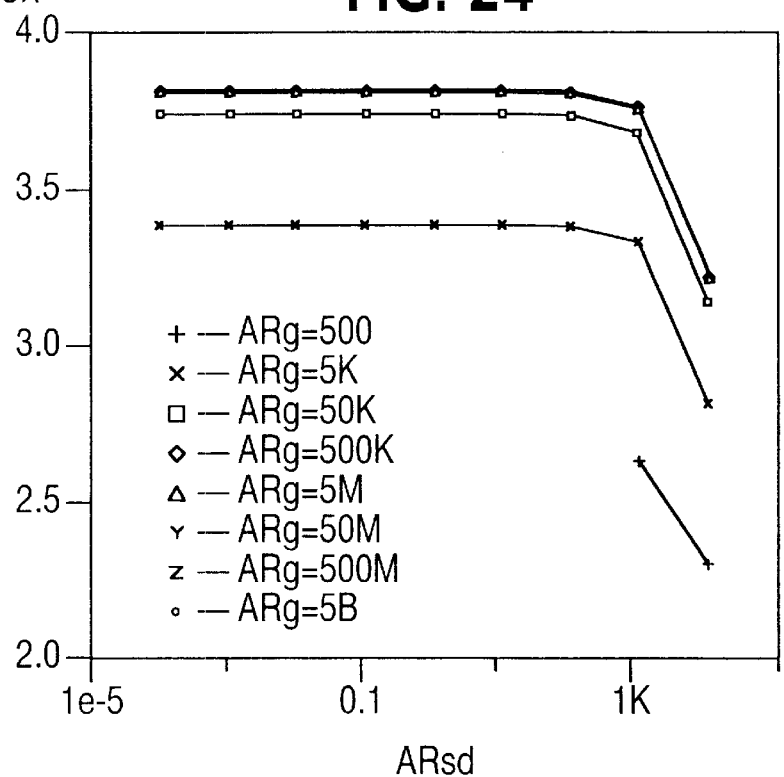
FIGS. 24–26 graph example data useful in explanation and understanding of operation of the FIGS. 18–21 example protective antenna embodiments, as well as advantages thereof.

More particularly, FIG. 24 graphs example data concerning Vox as a function of ARsd at various ARg with ARnw=10K (um–1), with the setup having Vp=10V, and a floating-source P MOSFET in an accumulation condition. That is, FIG. 24 shows a gate-oxide voltage as a function of the combined S and D antenna ratio at various gate-antenna ratios with a NW antenna ratio at 10K during positive-bias plasma cycles (with the P MOSFET in an accumulation condition). This data indicates that the gate-antenna ratio may go as far as 10K with any combined S/D antenna ratio, and still maintain a Vox not exceeding 3.6V (the known threshold for gate-oxide degradation).

Figure 25:
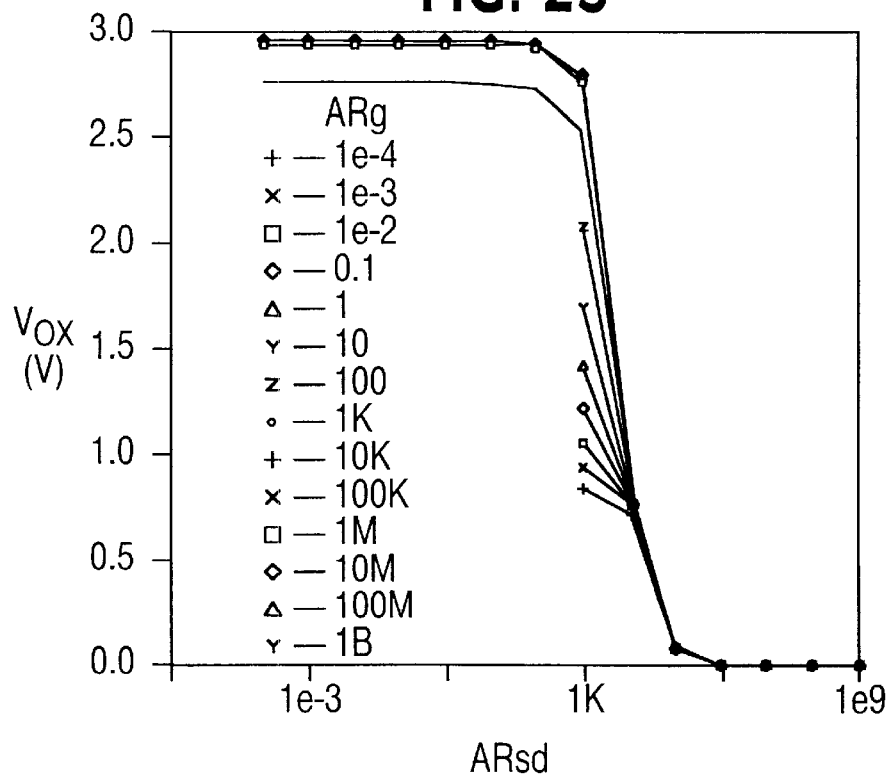
Figure 26:
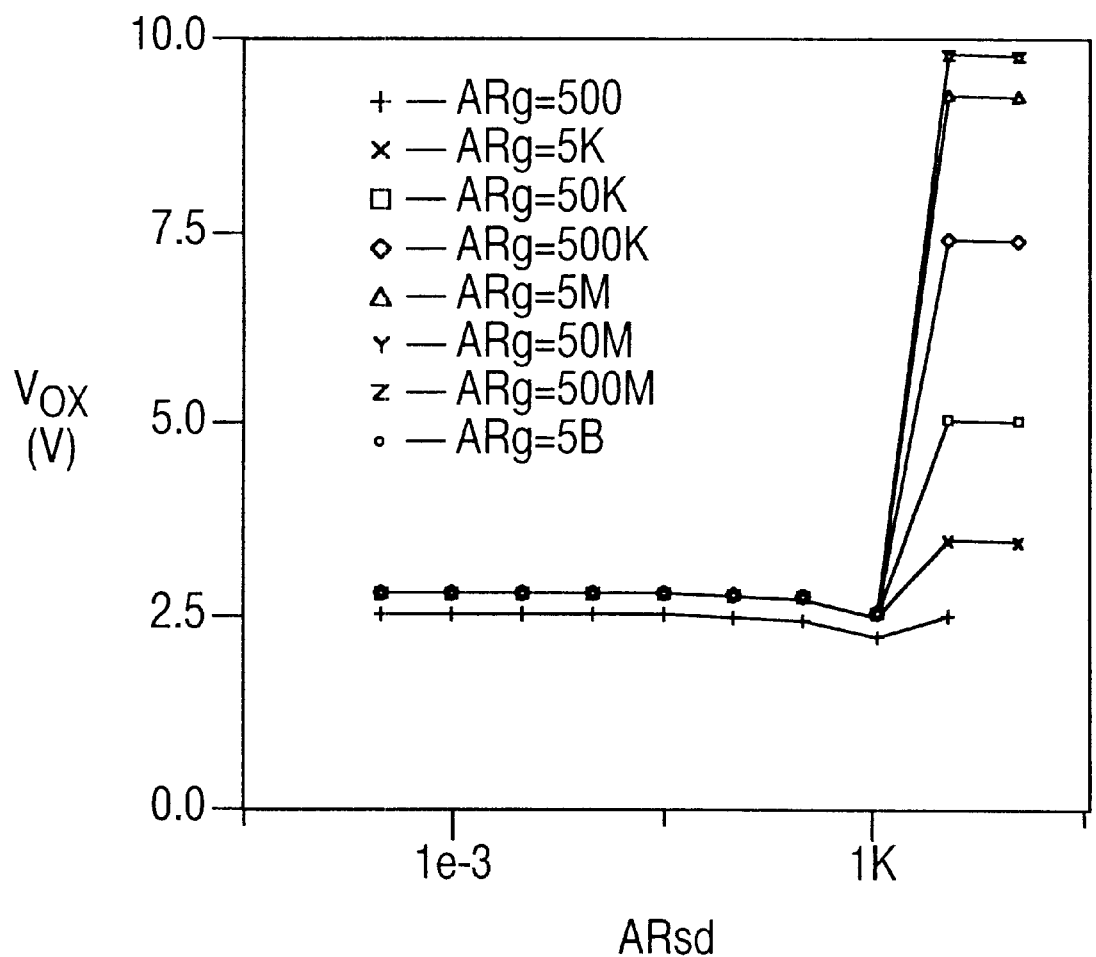

Continuing, FIG. 25 graphs example data concerning Vox as a function of ARsd at various ARg with ARnw=10K showing the Lo Vox state in the region of ARsd greater than around 5K, with the set-up having Vp=10V, and a floating-source P MOSFET in an inversion condition. FIG. 26 graphs example data concerning Vox as a function of ARsd at various ARg with ARnw=10K showing the Hi Vox state in the region of ARsd greater than around 5K, with the set-up having Vp=10V, and a floating-source P MOSFET in an inversion condition.

More particularly, FIGS. 25 and 26 show simulation results in an inversion condition (negative-bias plasma cycles). A phenomenon of bimodal Vox state was observed. Two Vox's, one low and the other high, can exist at a condition of same terminal antenna ratios. The high Vox state may impose a limit for how high the S and D antenna ratio can be increased when the data in the inversion condition is also considered.

As one example, detailed analysis from the above example data indicates that if one sets 5K as a maximum allowable gate-antenna ratio with the present example embodiment, then a minimum of the S, D and NW antenna ratio should be around 2K in order to maintain Vox below 3.6V. In this arrangement of the S, D and NW antenna ratio, gate-oxide damage may be minimized without placing a gated-diode at the G of the transistor.

In general summary, the antenna embodiments/invention address the problem of "efficiency in circuit design" due to the fact that (gated diode) protecting devices occupy a lot of space in circuits. In contrast, protective antennas do not necessarily add further structures/area to the IC layout, and instead, already-existing structures (e.g., metal lines, buses) may be carefully redesigned to further (in addition to their normal conduction functions) provide the protective antennas. As a result, a more relaxed gate-charging metal-antenna design rule such as the use of less or no (gated-diode) protecting devices may be effected to improve the design efficiency. This invention applies to both P and N MOSFETs.

In further summary of the above example antenna embodiments/invention, a large maximum allowable metal antenna ratio at the gate may be pre-determined, which takes advantage of the new discovery that an increase of an (metal) antenna at S, D and W terminals may help reduce damage in the gate oxide during a Normal-Mode gate-charging event. Such arrangements may facilitate failure of a much fewer number of MOSFETs during a charging design rule check. A total (metal) antenna at S, D and W (NW for floating-source P MOSFETs) terminal or at S and D (for grounded-source P MOSFETs and floaing-source N MOSFETS) terminal or at D (for grounded-source N MOSFETs) terminal may be increased to above a certain finite number.

To particularize more in terms of transistor types, for P MOSFETs with S not tied to NW, a total periphery length of the antennas (metal lines and/or buses) leading to the S, D and NW terminals of the protected transistor may be limited to above a certain finite amount. For P MOSFETs with S tied to NW and N MOSFETs with S not tied to PW, a total periphery length of the antennas (metal lines and/or buses) leading to the S and D terminals of the protected transistor may be limited to above a certain finite amount. For N MOSFETs with S tied to PW, a total periphery length of the antennas (metal lines and/or buses) leading to the D terminal of the protected transistor may be limited to above a certain finite amount. The aforementioned certain finite amount of total periphery length of the antennas (metal lines and/or buses) leading to the S, D and/or W terminals may be determined by a pre-determined maximum allowable periphery length of the (inadvertent or planned) antennas (metal lines and/or buses) leading to the G terminal. It also depends on the behavior of the bimodal Vox state in inversion condition of the MOSFETs. For those MOSFETs still failing a design rule check, a gated diode may be attached to their gate for protection.

In summarizing an example use of the embodiments in a single sentence, embodiments may use planned metal antennas to reduce gate-oxide charging damage in MOSFETs during a metal etch process for silicon-based ICs.

Combination Gate-diode/Antenna Example Embodiments

Next example embodiments turn to uses of combinations of the above protective diode $DI_P$ and/or protective antenna $ANT_P$ arrangements (types) to provide protection. More particularly, practice of embodiments of the present inventions may be not limited to using soley one type of protective arrangement across an entire IC circuit, or even with respect to a same component (e.g., transistor) or a same delicate structure (e.g., gate oxide). More particularly, there may very likely be instances where a first type of protective arrangement (e.g., protective diode $DI_P$) might be best applicable at a first location (e.g., a gate side of a delicate gate-oxide layer), and a second type of protective arrangement (e.g., protective antenna $ANT_P$) might be best applicable at a second location (e.g., a source, drain, or well side of a delicate gate-oxide layer).

The above-mentioned example, as well as any other combination example embodiments disclosed within the present section, are in no way limited to having certain types of protective arrangements on certain sides of a delicate structure, and instead may even have a mix-and-match of various types of protective arrangements on a same side of a delicate structure. Further, due to space, layout or other design constraints, some protective devices of a particular type may be provided (connected to a same terminal) in a form of several smaller same-type devices (e.g., several small antennas or plates (discussed ahead)), rather than a single larger device. The protective arrangements throughout the present disclosure should be thought of as respective tools which should be applied wherever appropriate in whatever combination suitable to provide the protection sought.

Simplified illustrations of various example embodiments (transistor arrangements) according to the above are now illustrated and described as follows.

Figure 27:
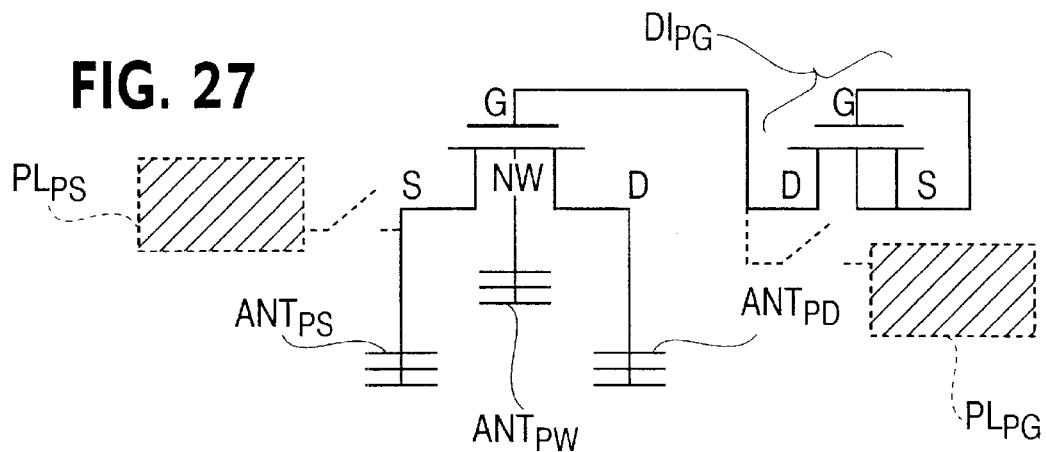
FIGS. 27–30 are example transistor embodiments including protective gated-diode/antenna (and gated-diode/antenna/plate) combination arrangements, such FIGS. being useful in gaining a more thorough understanding/appreciation of protective combination embodiments of the present invention.
Figure 28:
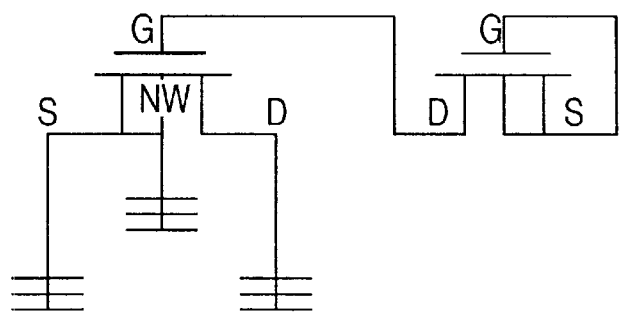

In a first group of simplistic DI/ANT combination example embodiments, a total antenna ratio or periphery length of the protective (metal) antenna (metal lines and/or buses) leading to the S, D and W terminal of the protected grounded- and floating-source P MOSFET may be limited to below a certain finite number. FIG. 27 illustrates an example floating-source P MOSFET having a DI/ANT combination of a protective gated-diode $DI_{PG}$ connected to the G and (planned (e.g., designed) protective antennas $ANT_P$, i.e., protective source antenna $ANT_{PS}$, protective drain antenna $ANT_{PD}$, protective well antenna $ANT_{PW}$, electrically connected to provide protection to the S, D and W, respectively, and with a limited metal antenna ratio at the S, D and W. (FIG. 27 protective plates $PL_{PS}$, $PL_{PG}$, (shown in phantom dashed-line form) are discussed ahead.) FIG. 28 illustrates a similar DI/ANT combination example grounded-source P MOSFET with a limited metal antenna ratio at the S, D and W.

Figure 29:
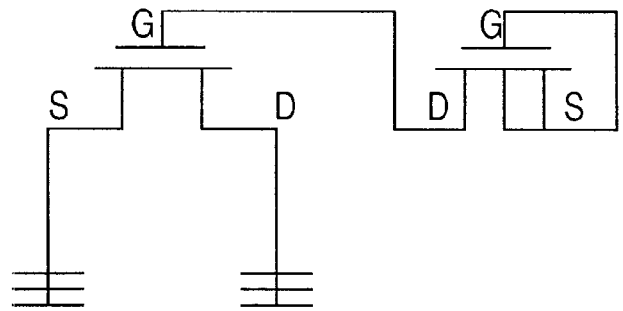

In a second group of simplistic DI/ANT combination example embodiments, a total antenna ratio or periphery length of the protective (metal) antenna (metal lines and/or buses) leading to the S and D terminal of the protected floating-source N MOSFET may be limited to below a certain finite number. FIG. 29 illustrates a DI/ANT combination example floating-source N MOSFET with a limited metal antenna ratio at the S and D.

Figure 30:
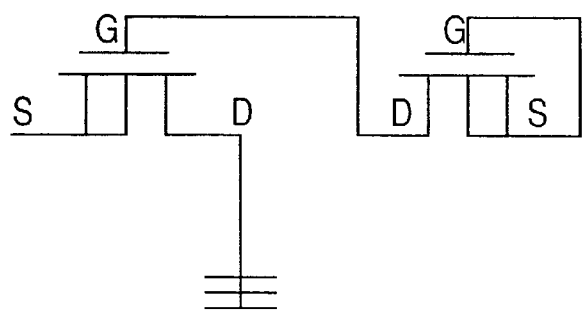

In a third group of simplistic DI/ANT combination example embodiments, a total antenna ratio or periphery length of the protective (metal) antenna (metal lines and/or buses) leading to the D terminal of the protected grounded-source N MOSFET may be limited to below a certain finite number. FIG. 30 illustrates an example DI/ANT combination grounded-source N-P MOSFET with a limited (metal) antenna ratio at D.

Redundant labeling of the protective $DI_P$ and/or protective $ANT_P$ may be omitted wholly or at least partially from FIGS. 28–30 (as well as related theoretical FIGS.) for sake of simplicity. Further, illustration of any inadvertent antennas $ANT_I$ may be omitted wholly or at least partially from FIGS. 27–30 (as well as related theoretical FIGS.) for sake of simplicity. Finally, further discussions of FIGS. 28–30 are similar to the discussions of FIG. 27 (and other prior FIGS.), and thus redundant discussions may be wholly or partially omitted for sake of brevity/simplicity.

Figure 31:
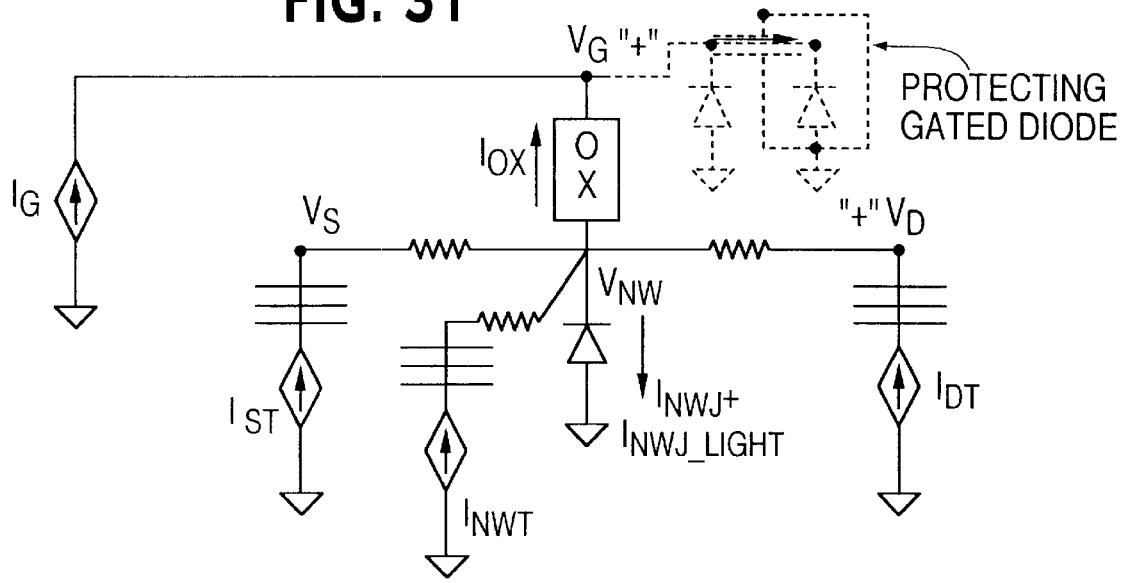
FIGS. 31–32 are example theoretical circuits useful in explanation and understanding of operation of the FIGS. 27–30 example protective combination embodiments, as well as advantages thereof.
Figure 32:
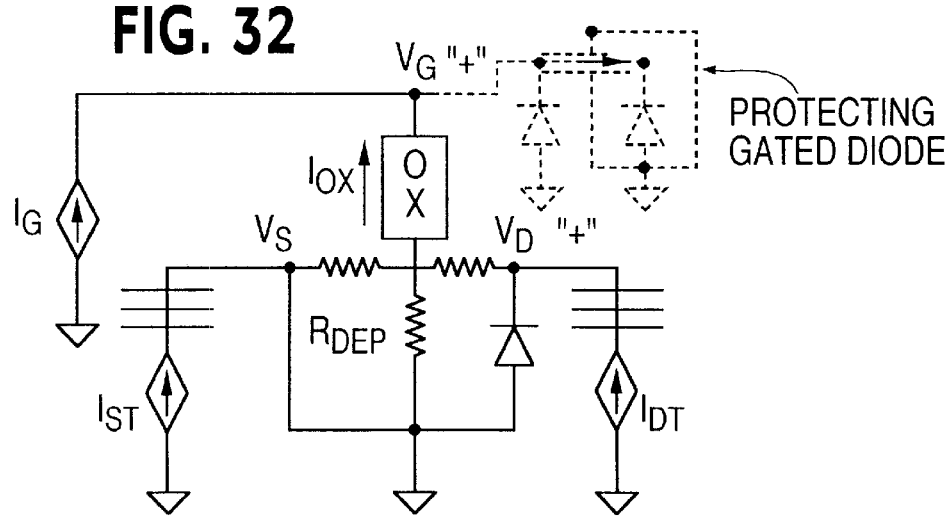

Turning now to theoretical discussions tending to prove a viability of the above, FIG. 31 illustrates an example DI/ANT combination P MOSFET with source tied or not tied to the NW during positive-bias plasma cycles (accumulation condition). A protective gated-diode is attached at the G terminal. A total metal antenna ratio of protective ANTs at the S, D and NW terminal may be limited to below a certain number to minimize the damage to gate-oxide in the Reverse-Mode gate-charging event. Note that the illustration here applies to both cases of P MOSFET with source tied and not tied to NW. In contrast, FIG. 32 illustrates an example DI/ANT combination N MOSFET with source not tied to the P substrate during positive-bias plasma cycles (inversion condition). A protective gated-diode is attached at the G terminal. A total metal antenna ratio of protective ANTs at the S and D terminal may be limited to below a certain number to minimize the damage to the gate-oxide in the Reverse-Mode gate-charging event.

With such arrangements illustrated in FIGS. 31 and 32, the antenna current at each of the terminals may be represented by a voltage controlled current source which may be a function of the antenna ratio, the terminal potential and the plasma potential. For example, at the S terminal, $I_{ST}=I_{ST}(AR_S, V_S, V_P)$. In FIG. 31, gate-oxide current in the Reverse Mode may be expressed as:

$$I_{OX} = I_{ST} + I_{DT} + I_{NWT} - I_{NWJ} - I_{NWJ\_LIGHT} \quad \text{Eq. (4)}$$
$$= I_{GD} - I_G$$

where $I_{OX}$ is an oxide layer current, $I_{NWJ}$ is an NW junction current, $I_{NWJ\_LIGHT}$ is an NW junction current caused by light, $I_{NWT}$ is an NW terminal current, $I_{ST}$ is a S terminal current, $I_{DT}$ is a D terminal current, $I_G$ is a G terminal current, and $I_{GD}$ is a G-to-DI current. Such formulas may be easily adapted for PW type transistor arrangements.

The above equation clearly shows the role of the antenna current at the S, D and W terminal—the supplier for gate-oxide current. Again, with the DI/ANT combination embodiments, reducing the total antenna ratio at the S, D and W terminal gives rise to a lower potential across the gate-oxide and hence lower damage to it since the potential at the G terminal is pulled down by the gated-diode to nearly the substrate potential. Therefore, when the total metal antenna ratio is reduced to a certain carefully chosen number, damage to the gate-oxide may be minimized.

Additional theoretical discussions as to viability of the DI/ANT combination embodiments is the same as the theoretical discussions set forth above with respect to other ones of the FIGS. (and especially FIGS. 1 and 6 and 7), so redundant discussion thereof is either wholly or partially omitted for sake of brevity/simplicity.

In summarizing an example use of the DI/ANT combination embodiments in a single sentence, embodiments may use both protective Gated-diodes and protective (metal) antenna to minimize gate-oxide charging damage in MOSFETs during a metal etch process for silicon-based ICs.

Sufficient protection for gate-oxide (or other delicate structures) may be achieved with the above combined use of gated-diode and metal antenna by minimizing the gate-oxide damage during the Reverse-Mode gate-charging effect.

Conductive "Plate" Example Embodiments

Next example embodiments will be described in a context where plasma-processing during formation of a later (higher, upper) IC layer (e.g., Metal 5 (M5)) induces charges in the upper layer, and where the use of a protective conductive plate (e.g., metal or polysilicon area) in an earlier (lower) IC layer (e.g., Metal 1 (M1)) may be used to provide a delicate IC structure (e.g., gate oxide) with protection from the induced charges. Practice of embodiments of the present invention is not limited to such context, or to protecting just gate oxides, or to plates made of metal or polysilicon materials.

More particularly, turning now to more detailed discussion, conductive "plate" example embodiments may address the problem of high gate-oxide charging damage caused by a substantial increase of the ratio between the gate-to-substrate impedance and the gate-to-plasma impedance during, for example: higher-layer inter-layer-dielectric (ILD) etch in the VIA formation process, passivation etch in the bond pad formation process, or pad sputtering in the C4 bump formation process. One disadvantageous approach to solve such problem is through adjustment of process conditions. That is, gate-charging damage may be alleviated by reducing either the plasma power, plasma etch or sputtering time. Such approaches are disadvantageous in that they decrease a speed of the manufacturing process.

The present conductive plate example embodiments alternatively solve the problem by connecting plates (e.g., polysilicon plate(s) or Metal-1 plate(s)) to the G of the MOSFET. A remainder of the disclosure may use polysilicon or metal plates in the description (again, it is stressed that practice of the present invention certainly is not limited thereto). The plate provides a small impedance (or large capacitance) in parallel with the MOSFET's existing gate-to-substrate impedance, hence substantially reducing the gate-to-substrate impedance and thus reducing the gate-to-substrate voltage during the plasma process. As a result, the potential across the gate-oxide (i.e., the difference between the gate-to-substrate voltage and the remaining-terminal (S, D and W)-to-substrate voltage) can be considerably reduced.

Further reduction of gate-charging damage may be achieved by placing polysilicon or Metal-1 plate(s) at the S, D and/or W (NW for P MOSFET) terminal of the protected MOSFET. This, though reduces the total impedances between these terminals and the substrate, and may cause some increase of the voltage between these terminals and the substrate due to the same ratio of increase between these terminal (S,D,W)-to-plasma impedances and terminal (S,D,W)-to-substrate impedances. As a result, the potential across the gate-oxide may be reduced further.

Figure 33:
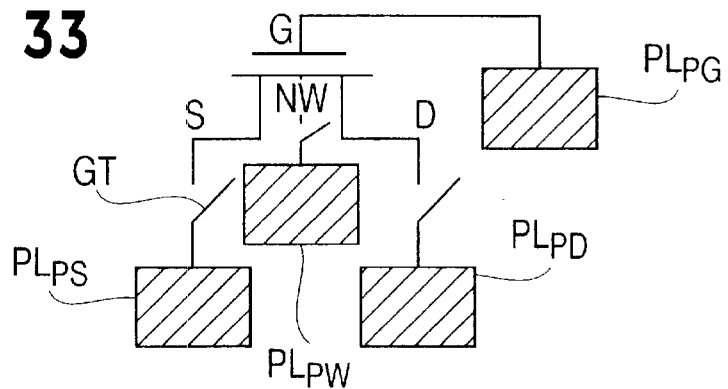
FIGS. 33–36 are example transistor embodiments including protective example S, D, W and/or G plate arrangements, such FIGS. being useful in gaining a more thorough understanding/appreciation of protective plate embodiments of the present invention.
Figure 34:
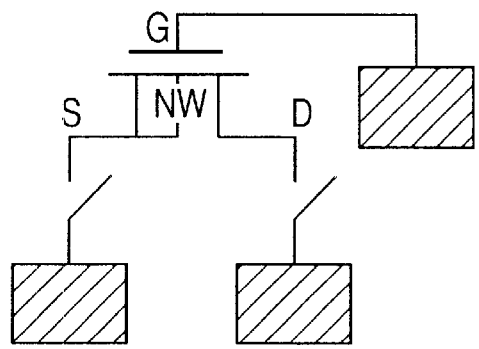
Figure 35:
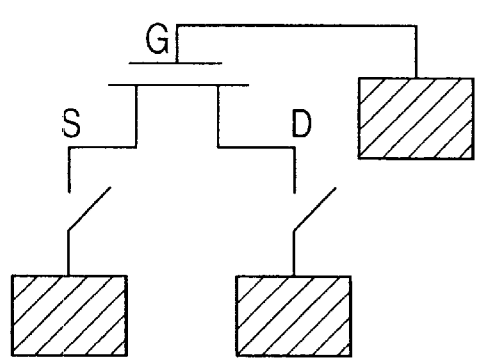
Figure 36:
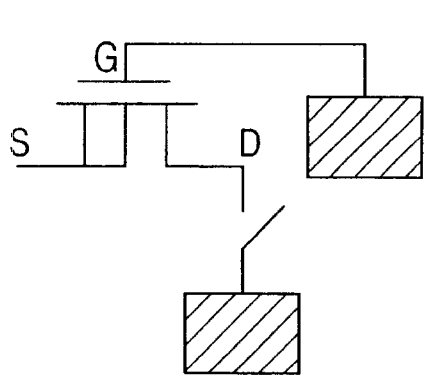

Turning now to simplified illustrations of various example embodiments (transistor arrangements) according to the above, FIG. 33 illustrates an example plate embodiment of a floating-source P MOSFET placed with a certain-finite-total-area polysilicon or Metal-1 plate(s) at the G, S, D and/or W terminals. More particularly, such FIG. includes planned protective plate $PL_{PG}$ connected to the G, a planned protective plate $PL_{PS}$ connected to the S, a planned protective plate $PL_{PD}$ connected to the D, and a planned protective plate $PL_{PW}$ connected to the well (NW in this example). FIG. 34 illustrates an example plate embodiment of a grounded-source P MOSFET placed with similar certain-finite-total-area polysilicon or Metal-1 plate(s) at the G, S and/or D terminals. FIG. 35 illustrates an example plate embodiment of a floating-source N MOSFET placed with certain-finite-total-area polysilicon or Metal-1 plate(s) at the G, S and/or D terminals. Finally, FIG. 36 illustrates an example plate embodiment of a grounded-source N MOSFET placed with certain-finite-total-area polysilicon or Metal-1 plate(s) at the G and D terminals. In all the above example embodiments, the plate(s) at the S, D and W terminals may be optional depending on the space in the circuit.

Redundant labeling of the protective plates $PL_P$ may be omitted wholly or at least partially from FIGS. 34–36 (as well as related theoretical FIGS.) for sake of simplicity. Further, illustration of any inadvertent antennas $ANT_I$ may be omitted wholly or at least partially from FIGS. 33–36 (as well as related theoretical FIGS.) for sake of simplicity. Finally, further discussions of FIGS. 34–36 are similar to the discussions of FIG. 33 (and other prior FIGS.), and thus redundant discussions may be wholly or partially omitted for sake of brevity/simplicity. As to plate shape, practice of embodiments of the present invention are not limited to any particular shape, i.e., as non-limiting examples, the plate may rectangular, square, any other geometric shape, any non-geometric (e.g., free-form) shape. In fact, a shape of available layout space within the IC layout layers may dictate a shape, size and/or location of any plate used.

Figure 37:
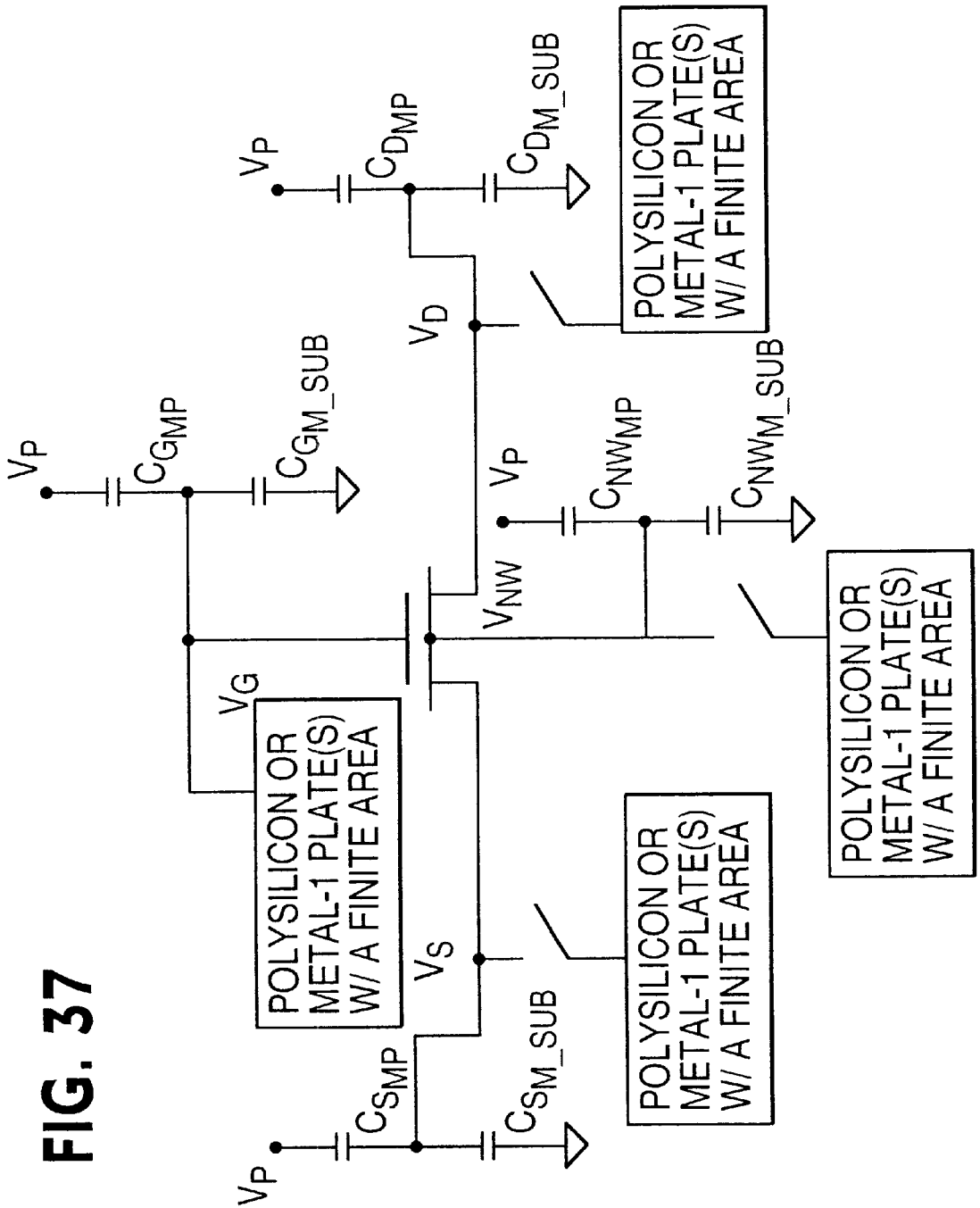
FIG. 37 is an example theoretical circuit useful in explanation and understanding of operation of the FIGS. 33–36 example protective antenna embodiments, as well as advantages thereof.

Turning now to theoretical discussions tending to prove a viability of the above, FIG. 37 illustrates an example embodiment (equivalent circuit) of a floating-source P MOSFET attempting to illustrate how this invention may reduce gate-oxide charging damage during higher-layer ILD etch in the VIA formation process, passivation etch in the bond pad formation process, or pad sputtering in the C4 bump formation process.

More particularly, the example embodiment illustrated in FIG. 37 has the placement of the polysilicon or Metal-1 plate(s) at the G terminal. The degree of the protection depends on the magnitude of the total placed plate(s)-to-substrate impedance (or capacitance) or the total area of the placed plate(s). The invention effectively reduces the charging damage in the gate-oxide in the situation when the MOSFET begins to experience charging damage—when the gate-to-substrate impedance of the MOSFET becomes much larger than the gate-to-plasma impedance during the plasma event.

One example is a single large M5 plate existing and attached to the G during Via5 (ILD5) etch. In this case, M5_plate-to-substrate impedance (capacitance) may be much larger (less) than the M5_plate-to-plasma impedance (capacitance). The coupling of the plasma potential (Vp) through these capacitances to the G terminal will be quite large, causing severe damage to gate-oxide if it is not properly protected. In this condition, placing polysilicon or lower-layer metal plate(s) at the G terminal will substantially reduce the gate-to-substrate impedance, thus improving the charging damage.

The placement of polysilicon or Metal-1 plate(s) at the S, D and/or W (NW for P MOSFET) terminal may also be optional depending on whether the circuit has enough space to accommodate them. Placement will improve gate-charging damage further, but not as dramatic as that gained by placing polysilicon or Metal-1 plate(s) at the G terminal alone. The degree of the improvement here depends on the total area of the plates placed at these terminals—the more the total area, the more the improvement. The reason for a further improvement on the charging damage to gate-oxide by the above placement of plate(s) at the S, D and/or W terminal may be that it causes some increase on the potential at these terminals (due to the same ratio of increase between these terminal (S,D,W)-to-plasma impedances and terminal (S,D,W)-to-substrate impedances), but none at the G terminal. As a result, the potential across the gate-oxide (Vox in both the overlap and channel region) decreases, and thus the charging damage to gate-oxide reduces further.

The following equations may be of relevance in an understanding of the above:

Vox:

Inversion Condition:

Overlap Region: $(|V_G-V_S|, |V_G-V_D|)$

Channel Region: $(|V_G-V_S|, |V_G-V_D|)$

Accumulation Condition:

Overlap Region: $(|V_G-V_S|, |V_G-V_D|)$

Channel Region: $|V_G-V_{NW}|$

Figure 38:
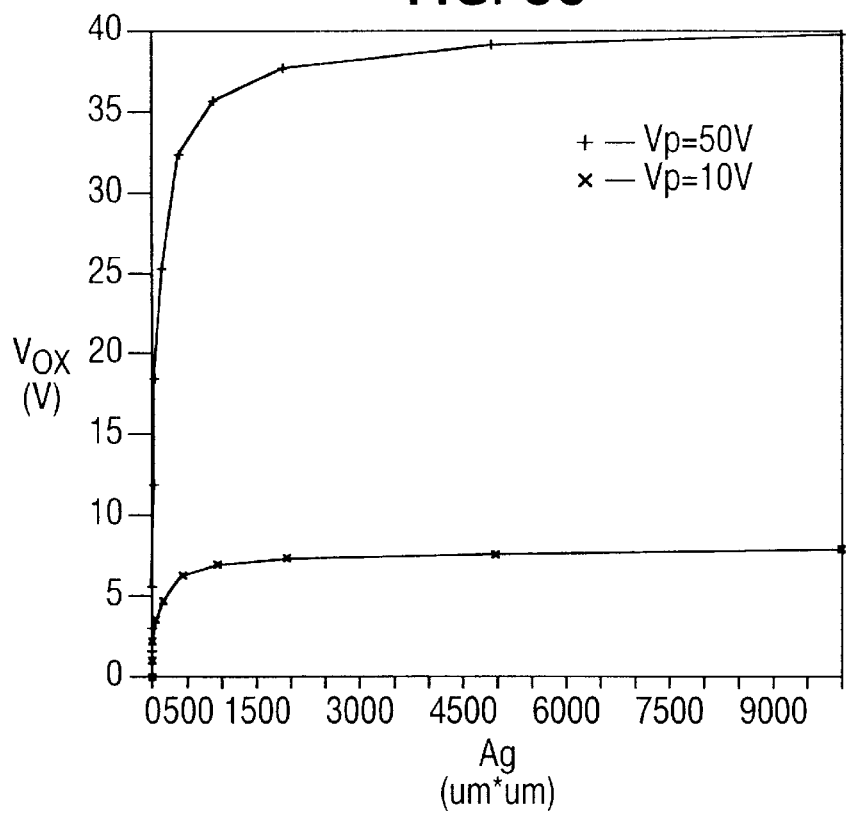
FIGS. 38–46 graph example data useful in explanation and understanding of operation of the FIGS. 33–36 example protective plate embodiments, as well as advantages thereof.

Turning now to experimental/simulation discussions, the following example theoretical data validating the antenna embodiments was obtained. More particularly, FIG. 38 graphs example data concerning Vox as a function of area of a M5 plate placed at the G terminal of a floating-source P MOSFET during positive-bias plasma cycles (accumulation condition) of a Via5 (ILD5) etch. Simulations were performed based on a known technology and a floating-source P MOSFET. That is, FIG. 38 shows a result of Via5 (ILD5) etch under a condition that there is only one single Metal-5 plate connected to the G terminal of the P MOSFET. This single M-5 plate simulates the effect of the impedance of existing M5 antenna which are not necessarily plates, but perhaps nested or un-nested bus lines.

The result shows that Vox increases as the area of the M5 plate increases. The trend becomes saturated as the area approached to be about 1500 um*um. This may be due to the fact that the same ratio of increase between the M5_plate-to-plasma impedance and M5_plate-to-substrate impedance as the plate area increases. For the known technology used, gate-oxide damage occurs at Vox>3.6V which is the threshold for gate-oxide degradation. This indicates that the damage could happen at the area of the M5 plate around 200 um*um, even at 10V of the plasma potential.

Figure 39:
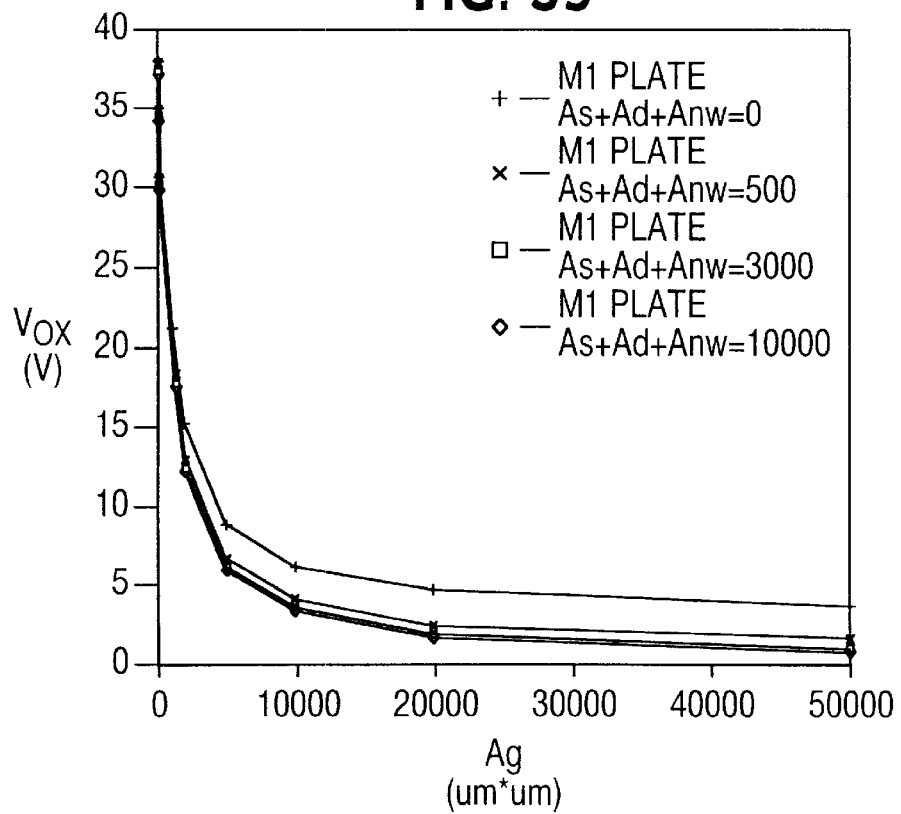
Figure 40:
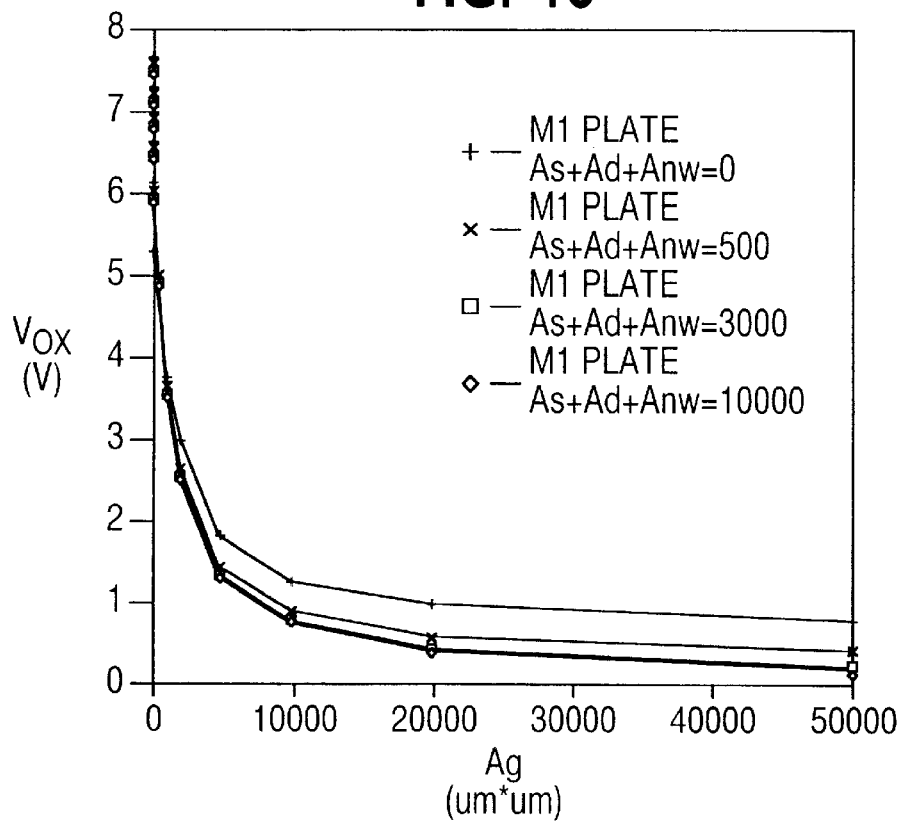

Accordingly, FIG. 38's 3000 um*um M5 plate shows about 38 and 7.5V of Vox at Vp=50 and 10V respectively. Using this 3000 um*um M5 plate as the problematic condition, simulations were performed to see the effect when a lower-layer M1 plate is placed at the G terminal. The simulation result is shown in FIGS. 39 and 40. More particularly, FIG. 39 graphs example data concerning Vox as a function of the area of the M1 plate placed at the G terminal of a floating-source P MOSFET during Via5 (ILD5) etch. A 3000 um*um M5 plate exists at the G terminal, the transistor is in accumulation condition (in positive-bias plasma cycle), and plasma potential is 50V. FIG. 40 concerns the same setup, but graphs example data where a plasma potential is 10V.

Such FIGS. 38–40 show that Vox reduces dramatically as the area of the M1 plate varies from 0 to 50K um*um. The effect of the total area of M1 plate(s) placed at S, D and W terminal is also shown, indicating that the more the total area, the less Vox is. However, the trend becomes saturated as the total area approaches around 1500 um*um.

Figure 41:
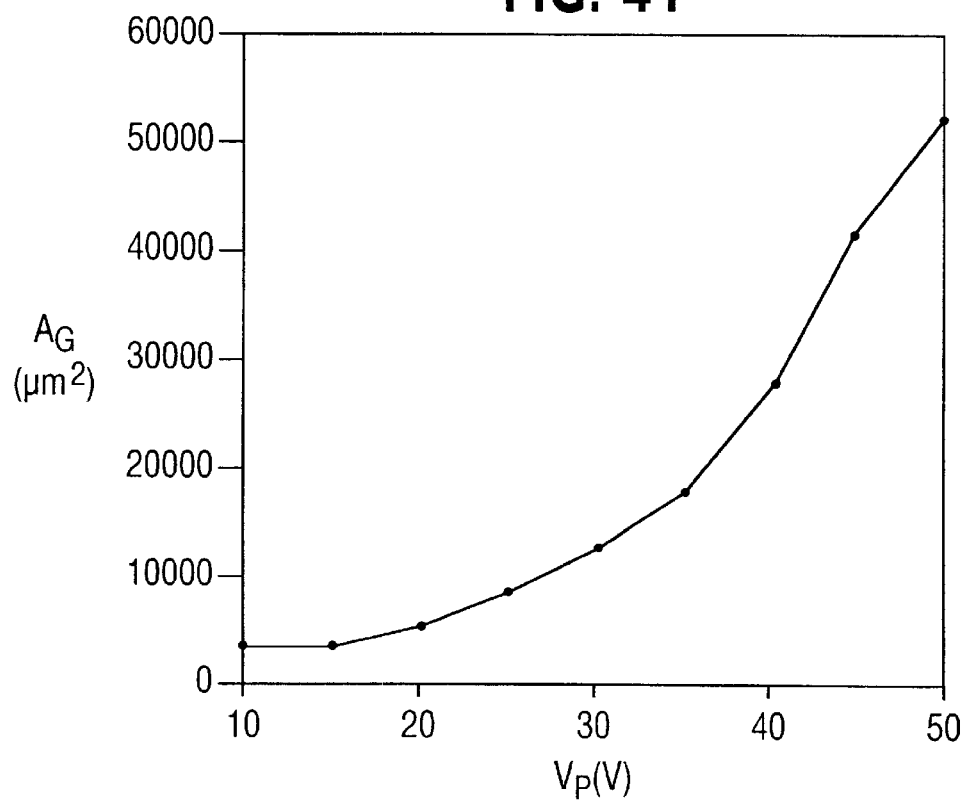

Continuing, FIG. 41 graphs example data concerning an area of the M1 Plate placed at G to maintain Vox at 3.5V (a voltage just below the threshold for known gate-oxide degradation) as a function of the plasma potential for a floating-source P MOSFET during the Via5 (ILD5) etch. No M1 plates are placed at S, D and NW terminal. Specifically, a 3000 um*um M5 plate exists at the G terminal. The transistor is in accumulation condition (in a positive-bias plasma cycle).

Figure 42:
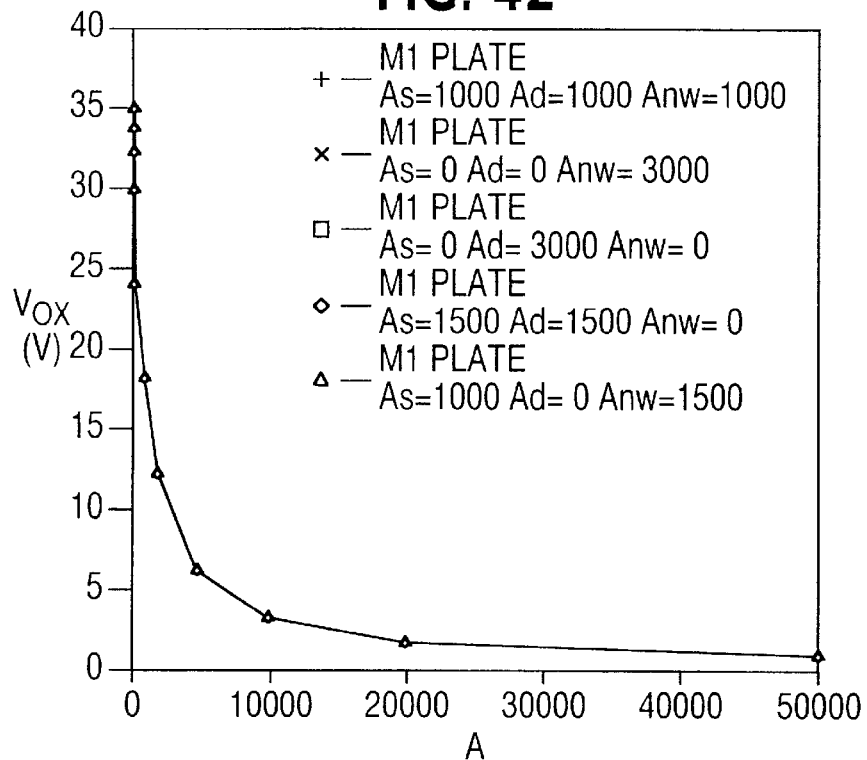

FIG. 42 graphs example data concerning Vox as a function of the area of the M1 plate placed at the G terminal of a floating-source P MOSFET during a Via5 (ILD5) etch. Again, a 3000 um*um M5 plate exists at the G terminal. The transistor is in an accumulation condition (in positive-bias plasma cycle), and plasma potential is 50V. FIG. 42 shows the investigated result for Vox when the total area of the plates placed at the S, D and/or NW terminal is a constant at 3000 um*um, but with different contributions from each of the plates. All five cases show a substantially identical result, indicating that Vox may be only dependent on total area of the plates placed at these three terminals.

Figure 43:
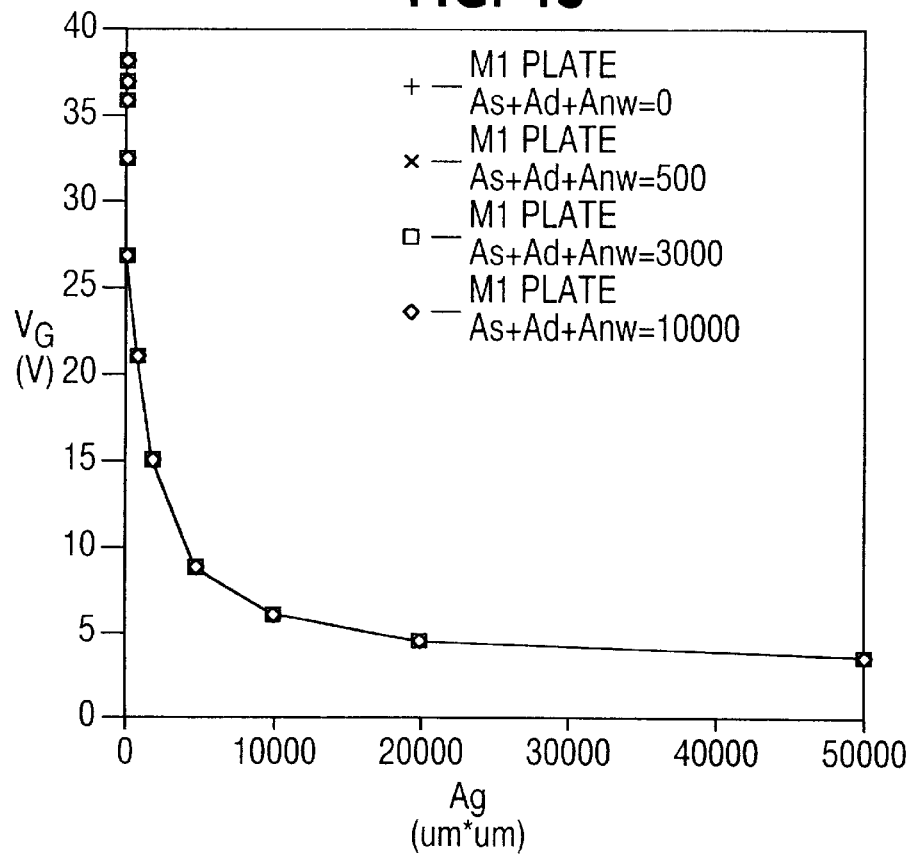
Figure 44:
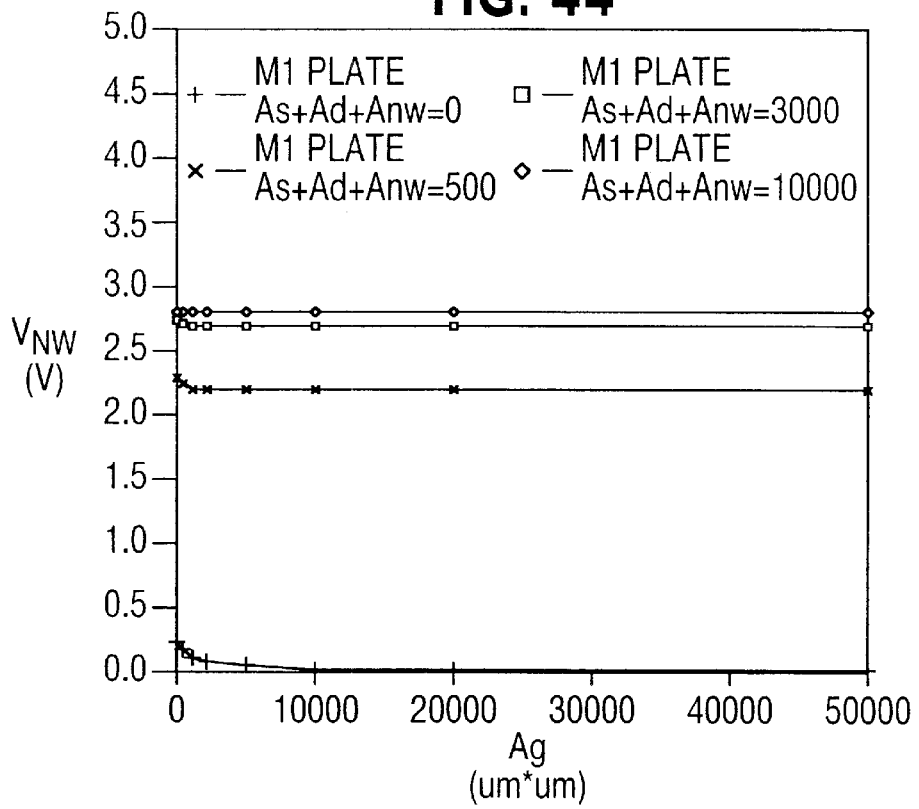

Moving on, FIG. 43 graphs example data concerning Vg as a function of the area of the M1 plate placed at the G terminal of a floating-source P MOSFET during Via5 (ILD5) etch. A 3000 um*um M5 plate exists at the G terminal. The transistor is in an accumulation condition (in positive-bias plasma cycle), and plasma potential is 50V. FIG. 44 concerns the same setup, but graphs example data where a plasma potential is 10V. The simulation results in FIGS. 43 and 44 show where the reduction of Vox comes from when total area of the plates placed at the S, D and/or W terminal increases. The potential at the G terminal of the P MOSFET virtually has no change as the total area of these plates increases. However, the potential at the W (in this particular case, the plate at the S, D and NW terminal have the same area, thus potential at these three terminals are the same when P MOSFET is in accumulation condition here) increases as the total area of the plates at the three terminals increases. This explains why Vox decreases as the total area of the plates at the three terminals increases.

Figure 45:
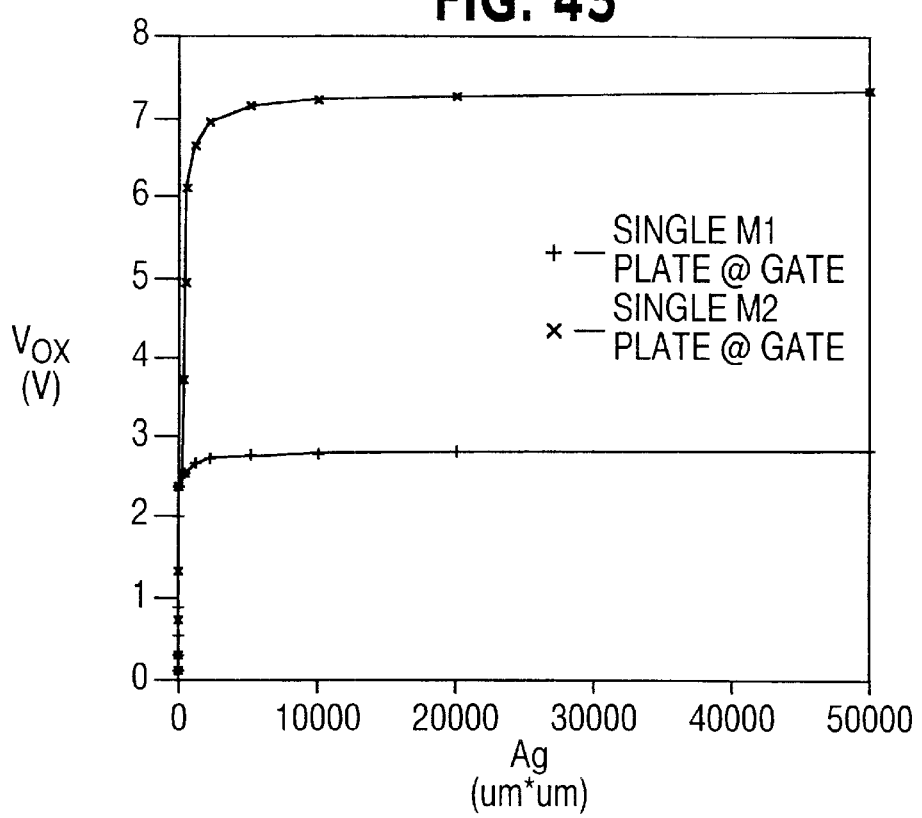
Figure 46:
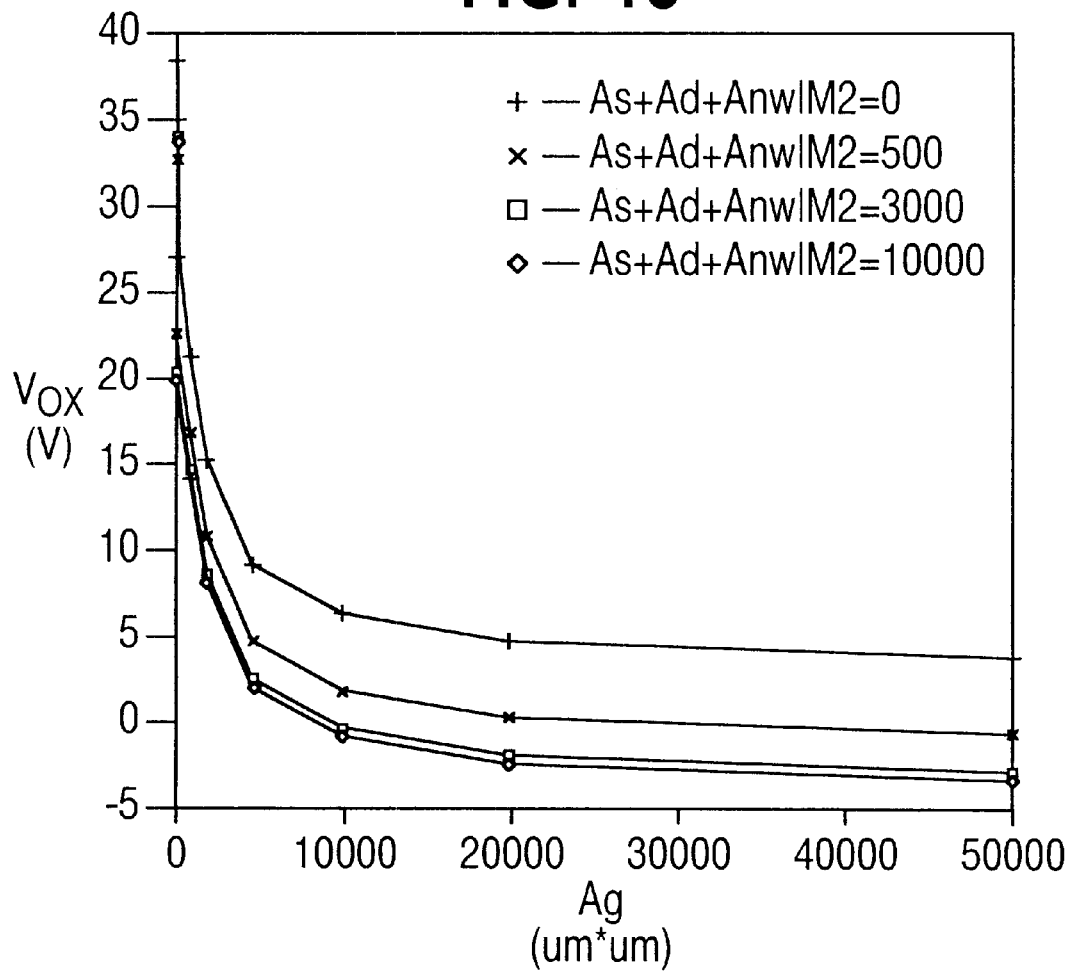

As a next FIG., FIG. 45 graphs example data concerning Vox as a function of an area of a metal plate placed at the G terminal of a floating-source P MOSFET during positive-bias plasma cycles (accumulation condition) of a Via5 (ILD5) etch. More specifically, FIG. 45 shows Vox as a function of area of a single M1 and M2 plate placed at the G terminal under the condition of plasma potential at 50V and no other metals at the G, S, D and NW terminal. This result indicates that only placing Metal-1 plate can assure that there will be no side-effect problem, such as the condition here when there is no existing metals at the G terminal, which is likely a common occurrence in circuit layouts FIG. 46 graphs example data concerning Vox as a function of an area of the M1 plate placed at a G terminal of a floating-source P MOSFET during positive-bias plasma cycles (accumulation condition) of a Via5 (ILD5) etch. An effect of different total areas of M2 plates placed at the S, D and NW terminals is examined. More particularly, FIG. 46 is the simulation result showing the effect of the protection by placing M2 plate at the S, D and/or NW terminals of the transistor under the condition of an existing 3000 um*um M5 plate and a protecting M1 plate at the G terminal. Plasma potential is 50V. The area of the protecting M1 plate varies from 0 to 50000 um*um in simulation. It is clear to see that a greater total area of the M2 plates at the S, D and /or NW terminal drives gate-oxide voltage or current into an opposite direction and increases its magnitude. This data confirms that Metal-1 plates can be placed at the S, D and/or W terminal for further improvement on gate-charging damage.

In summary of the above protective "plate" example embodiments, such embodiments uses plate(s) (e.g., polysilicon or Metal-1 plate(s) to effectively reduce the plasma process induced charging damage in gate-oxide during Inter-Layer-Dielectric (ILD) etch step in: a VIA formation process, passivation etch step in bond pad formation process, or pad sputtering step in C4 Bump formation process for silicon-based integrated circuits. This invention applies to both P and N MOSFETs. This invention does not require any change in process condition or parameters, and thus a manufacturing time is not disadvantageously affected. This invention solves the problem through device layout configuration. It can be easily implemented because of its simple nature.

Important elements of the protective "plate" embodiments may be summarized as follows. Plates (polysilicon or Metal-1 plate(s)) with a finite amount of area is (are) placed and connected to the G of the protected MOSFET. Plates (e.g., polysilicon or Metal-1 plate(s)) of a finite amount of area may also (space permitting) be placed and connected to S, D and/or NW (for P MOSFET) terminal of the protected MOSFET. (This will further reduces gate-charging damage).

In summarizing an example use of the protective plate embodiments in a single sentence, embodiments may use polysilicon or Metal-1 plate(s) to effectively reduce gate-oxide charging damage in MOSFETs during: an inter-layer-dielectric (ILD) etch step of VIA formation, passivation etch step of bond pad formation or pad sputtering step of C4 bump formation for silicon-based ICs.

Combination Gate-diode/Antenna/Plate Example Embodiments

Next example embodiments turn to combinations of the above protective diode $DI_P$, protective antenna $ANT_P$ and/or protective plate $PL_P$ arrangements (types) to provide protection. More particularly, practice of embodiments of the present inventions is not limited to using soley one or even two types of protective arrangement across an entire IC circuit, or even with respect to a same component (e.g., transistor) or a same delicate structure (e.g., gate oxide). More particularly, there may very likely be instances where a first type of protective arrangement (e.g., protective diode $DI_P$) might be best applicable at a first location (e.g., a gate side of a delicate gate-oxide layer), a second type of protective arrangement (e.g., protective antenna $ANT_P$) might be best applicable at a second location (e.g., a source, drain, or well side of a delicate gate-oxide layer), and a third type of protective arrangement (e.g., protective plate $PL_P$) might be best applicable at a third location (e.g., a source, drain, or well side of a delicate gate-oxide layer).

The above-mentioned example, as well as any other combination example embodiments disclosed within the present section, are in no way limited to having certain types of protective arrangements on certain sides of a delicate structure, and instead, may have a mix-and-match of various types of protective arrangements on a same side of a delicate structure. Accordingly, the protective arrangements throughout the present disclosure should be thought of as respective tools which should be applied wherever appropriate in whatever combination suitable to provide the protection sought.

As one simplistic DI/ANT/PL combination example embodiment, attention is directed back to the FIG. 27

DI/ANT combination example, where additional example gated plates PL$_{PS}$ and PL$_{PG}$ are further shown in representative dashed line form. Further redundant discussions may be wholly or partially omitted for sake of brevity/simplicity.

Additional theoretical discussions as to viability of the DI/ANT/PL combination embodiments may be the same as the theoretical discussions set forth above with respect to other ones of the FIGS. (and especially FIG. 27), so redundant discussion thereof is either wholly or partially omitted for sake of brevity/simplicity.

In summarizing an example use of the DI/ANT/PL combination embodiments in a single sentence, embodiments may use various combinations of protective Gated-diodes, protective (metal) antenna and protective plates to minimize gate-oxide charging damage in MOSFETs during a metal etch process for silicon-based ICs. Sufficient protection for gate-oxide (or other delicate structures) may be achieved with the above combined use of gated-diode(s), antenna(s) and plate(s) by minimizing the gate-oxide damage during the Reverse-Mode gate-charging effect.

In concluding, reference in the specification to "one embodiment", "an embodiment", "example embodiment", etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments. Furthermore, for ease of understanding, certain method procedures may have been delineated as separate procedures; however, these separately delineated procedures should not be construed as necessarily order dependent in their performance, i.e., some procedures may be able to be performed in an alternative ordering, simultaneously, etc.

Further, the present invention may be practiced as a software invention, implemented in the form of a machine-readable medium having stored thereon at least one sequence of instructions that, when executed, causes a machine to effect the invention. More particularly, in addition to being physically embodied in physical IC circuits, embodiments of the present invention may also be practice in virtual (but tangible) form where code stored on a machine-readable medium contains a configuration of an IC circuit having the gated-diode, antenna and/or plate protective arrangements included as part of the IC layout. Such should be interpreted as being within a scope of the present invention (i.e., claims). With respect to the term "machine", such term should be construed broadly as encompassing all types of machines, e.g., a non-exhaustive listing including: computing machines, non-computing machines, communication machines, etc. Similarly, which respect to the term "machine-readable medium", such term should be construed as encompassing a broad spectrum of mediums, e.g., a non-exhaustive listing including: magnetic medium (floppy disks, hard disks, magnetic tape, etc.), optical medium (CD-ROMS, DVD-ROMs, etc.), etc.

This concludes the description of the example embodiments. Although the present invention has been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. A charging-damage reducing arrangement comprising:
   a charging-damage-sensitive semiconductor structure sensitive to charges induced during a semiconductor manufacturing processing, the structure having at least a first electrical terminal and a second electrical terminal on opposing electrical sides of the structure; and
   at least one protective device connected to each of the first electrical terminal and the second electrical terminal, each protective device to reduce at least one of a charging-induced voltage potential across, and a charging-induced current through, the structure during semiconductor manufacturing, the at least one protective device being a protective diode to remove charge away from the structure.

2. An arrangement as claimed in claim 1, the arrangement being part of an electronic semiconductor component.

3. An arrangement as claimed in claim 2, the component being a transistor, wherein the first electrical terminal is a gate structure of the transistor, the second terminal is at least one of a source, drain and well structure of the transistor, and wherein the at least one protective device being the protective diode connected to the second terminal.

4. An arrangement as claimed in claim 3, wherein a separate protective diode is connected to at least two of the source, drain and well structure of the transistor as one of the at least one protective device.

5. An arrangement as claimed in claim 3, the transistor being a field-effect transistor (FET), and the charges induced are plasma processing induced charges.

6. An arrangement as claimed in claim 5, the FET being a metal oxide semiconductor—field effect transistor (MOSFET).

7. An arrangement as claimed in claim 1, wherein charging is plasma processing induced charges, each protective device to reduce the at least one of the charging-induced voltage potential across, and the charging-induced current through, the structure, during both a positive-bias accumulation plasma cycle and a negative-bias inversion plasma cycle.

8. An arrangement as claimed in claim 1, comprising a plurality of protective devices, the plurality including at least two mutually different types of protective devices, a first protective device-type being the protective diode to remove processing-induced charge away from the structure, and a second protective device-type being a protective antenna to deliver processing-induced charge to the structure during the semiconductor manufacturing processing.

9. A semiconductor substrate including a charging-damage reducing arrangement, the substrate comprising:
   a charging-damage-sensitive semiconductor structure sensitive to charges induced during a semiconductor manufacturing processing, the structure having at least a first electrical terminal and a second electrical terminal on opposing electrical sides of the structure; and
   at least one protective device connected to each of the first electrical terminal and the second electrical terminal, each protective device to reduce at least one of a charging-induced voltage potential across, and a charging-induced current through, the structure during semiconductor manufacturing, the at least one protective device being a protective diode to remove charge away from the structure.

10. A substrate as claimed in claim 9, the arrangement being part of an electronic semiconductor component.

11. A substrate as claimed in claim 10, the component being a transistor, wherein the first electrical terminal is a gate structure of the transistor, the second terminal is at least one of a source, drain and well structure of the transistor, and wherein the at least one protective device being the protective diode connected to the second terminal.

12. A substrate as claimed in claim 11, wherein a separate protective diode is connected to at least two of the source, drain and well structure of the transistor as one of the at least one protective device.

13. A substrate as claimed in claim 11, the transistor being a field-effect transistor (FET), and the charges induced are plasma processing induced charges.

14. A substrate as claimed in claim 13, the FET being a metal oxide semiconductor—field effect transistor (MOSFET).

15. A substrate as claimed in claim 9, wherein charging is plasma processing induced charges, each protective device to reduce the at least one of the charging-induced voltage potential across, and the charging-induced current through, the structure, during both a positive-bias accumulation plasma cycle and a negative-bias inversion plasma cycle.

16. A substrate as claimed in claim 9, comprising a plurality of protective devices, the plurality including at least two mutually different types of protective devices, a first protective device-type being the protective diode to remove processing-induced charge away from the structure, and a second protective device-type being a protective antenna to deliver processing-induced charge to the structure during the semiconductor manufacturing processing.

17. A charging-damage reducing arrangement comprising:

a charging-damage-sensitive semiconductor structure sensitive to charges induced during a semiconductor manufacturing processing, the structure having at least a first electrical terminal and a second electrical terminal on opposing electrical sides of the structure; and at least one protective device means connected to each of the first electrical terminal and the second electrical terminal, each protective device means for reducing at least one of a charging-induced voltage potential across, and a charging-induced current through, the structure during semiconductor manufacturing, the at least one protective device means being a protective diode means to remove charge away from the structure.

18. An arrangement as claimed in claim 17, the arrangement being part of an electronic semiconductor component.

19. An arrangement as claimed in claim 18, the component being a transistor, wherein the first electrical terminal is a gate structure of the transistor, the second terminal is at least one of a source, drain and well structure of the transistor, and wherein the at least one protective device means being the protective diode means connected to the second terminal.

20. An arrangement as claimed in claim 19, wherein a separate protective diode means is connected to at least two of the source, drain and well structure of the transistor as one of the at least one protective device means.

21. An arrangement as claimed in claim 19, the transistor being a field-effect transistor (FET), and the charges induced are plasma processing induced charges.

22. An arrangement as claimed in claim 21, the FET being a metal oxide semiconductor—field effect transistor (MOSFET).

23. An arrangement as claimed in claim 17, wherein charging is plasma processing induced charges, each protective device means for removing the at least one of the charging-induced voltage potential across, and the charging-induced current through, the structure, during both a positive-bias accumulation plasma cycle and a negative-bias inversion plasma cycle.

24. An arrangement as claimed in claim 17, comprising a plurality of protective device means, the plurality including at least two mutually different types of protective device means, a first protective means device-type being the protective diode means for removing processing-induced charge away from the structure, and a second protective means device-type being a protective antenna means for delivering processing-induced charge to the structure during the semiconductor manufacturing processing.

25. A machine-readable medium having stored thereon at least one sequence of instructions that, when executed, causes a machine to implement a charging-damage reducing arrangement comprising:

a charging-damage-sensitive semiconductor structure sensitive to charges induced during a semiconductor manufacturing processing, the structure having at least a first electrical terminal and a second electrical terminal on opposing electrical sides of the structure; and at least one protective device connected to each of the first electrical terminal and the second electrical terminal, each protective device to reduce at least one of a charging-induced voltage potential across, and a charging-induced current through, the structure during semiconductor manufacturing, the at least one protective device being a protective diode to remove charge away from the structure.

26. A medium as claimed in claim 25, the arrangement being part of an electronic semiconductor component.

27. A medium as claimed in claim 26, the component being a transistor, wherein the first electrical terminal is a gate structure of the transistor, the second terminal is at least one of a source, drain and well structure of the transistor, and wherein the at least one protective device being the protective diode connected to the second terminal.

28. A medium as claimed in claim 27, wherein a separate protective diode is connected to at least two of the source, drain and well structure of the transistor as one of the at least one protective device.

29. A medium as claimed in claim 27, the transistor being a field-effect transistor (FET), and the charges induced are plasma processing induced charges.

* * * * *

UNITED STATES PATENT AND TRADEMARK OFFICE
CERTIFICATE OF CORRECTION

PATENT NO. : 6,624,480 B2
DATED : September 23, 2003
INVENTOR(S) : Wallace W. Lin et al.

It is certified that error appears in the above-identified patent and that said Letters Patent is hereby corrected as shown below:

Column 6,
Line 54, after "1e4" insert -- (in unit of $um^{-1}$) --.

Column 14,
Line 14, after "2K" insert -- ($um^{-1}$) --; and
Line 20, after "S+DAR" insert -- ($um^{-1}$) --.

Column 15,
Line 35, change "floaing" to -- floating --.

Column 16,
Line 66, change "N-P" to -- N --.

Column 20,
Lines 14-24, should read as follows:
-- Vox:
   Inversion Condition:
   Overlap Region: $|V_G-V_S|$, $|V_G-V_D|$
   Channel Region: $|V_G-V_S|$, $|V_G-V_D|$ Accumulation Condition:
   Overlap Region: $|V_G-V_S|$, $|V_G-V_D|$
   Channel Region: $|V_G-V_{NW}|$ --

Signed and Sealed this

Twentieth Day of January, 2004

JON W. DUDAS
*Acting Director of the United States Patent and Trademark Office*

UNITED STATES PATENT AND TRADEMARK OFFICE
CERTIFICATE OF CORRECTION

PATENT NO.    : 6,624,480 B2
DATED         : September 23, 2003
INVENTOR(S)   : Wallace W. Lin et al.

It is certified that error appears in the above-identified patent and that said Letters Patent is hereby corrected as shown below:

Column 6,
Line 54, after "1e4" insert -- (in unit of $um^{-1}$) --.

Column 14,
Line 14, after "2K" insert -- ($um^{-1}$) --; and
Line 20, after "S+DAR" insert -- ($um^{-1}$) --.

Column 15,
Line 35, change "floaing" to -- floating --.

Column 16,
Line 66, change "N-P" to -- N --.

Column 20,
Lines 14-24, should read as follows:
-- Vox:
   Inversion Condition:
   Overlap Region: $|V_G-V_S|$, $|V_G-V_D|$ Accumulation Condition:
   Overlap Region: $|V_G-V_S|$, $|V_G-V_D|$
   Channel Region: $|V_G-V_{NW}|$ --

This certifictae supersedes Certificate of Correction issued January 20, 2004.

Signed and Sealed this

Ninth Day of November, 2004

JON W. DUDAS
*Director of the United States Patent and Trademark Office*